(12) United States Patent
Lee et al.

(10) Patent No.: US 11,747,685 B2
(45) Date of Patent: Sep. 5, 2023

(54) DISPLAY DEVICE, MANUFACTURING METHOD THEREOF, AND MULTI-DISPLAY DEVICE

(71) Applicant: Samsung Display Co., Ltd., Yongin-Si (KR)

(72) Inventors: Sang-Myoung Lee, Asan-si (KR); SangHyun Kang, Hwaseong-si (KR); Sejin Kim, Cheonan-si (KR); Mincheol Chae, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 213 days.

(21) Appl. No.: 16/879,673

(22) Filed: May 20, 2020

(65) Prior Publication Data

US 2021/0033909 A1 Feb. 4, 2021

(30) Foreign Application Priority Data

Aug. 2, 2019 (KR) ........................ 10-2019-0094568

(51) Int. Cl.
| | | |
|---|---|---|
| G02F 1/1345 | (2006.01) | |
| G02F 1/1362 | (2006.01) | |
| H05K 1/18 | (2006.01) | |
| H05K 3/30 | (2006.01) | |
| H01L 27/12 | (2006.01) | |
| G02F 1/1333 | (2006.01) | |

(52) U.S. Cl.
CPC ...... *G02F 1/13452* (2013.01); *G02F 1/13336* (2013.01); *G02F 1/136286* (2013.01); *H01L 27/124* (2013.01); *H01L 27/1259* (2013.01); *H05K 1/189* (2013.01); *H05K 3/303* (2013.01); *G02F 1/136295* (2021.01); *H05K 2201/10136* (2013.01); *H05K 2203/107* (2013.01)

(58) Field of Classification Search
CPC ............ G02F 1/13452; G02F 1/13336; G02F 1/136286; G02F 1/1345; G02F 1/13454; G02F 1/13456; G02F 1/13458; G02F 1/136295; H01L 27/124; H01L 27/1259; H05K 1/189; H05K 3/303; H05K 2201/10136; H05K 2203/107
USPC .................................................. 349/149–152
See application file for complete search history.

(56) References Cited

U.S. PATENT DOCUMENTS

| | | |
|---|---|---|
| 8,994,042 B2 | 3/2015 | Kang et al. |
| 10,090,334 B2 | 10/2018 | Bae et al. |
| 10,156,748 B2 | 12/2018 | Wu et al. |

(Continued)

FOREIGN PATENT DOCUMENTS

| | | |
|---|---|---|
| KR | 10-2014-0136233 A | 11/2014 |
| KR | 10-2015-0074275 A | 7/2015 |

(Continued)

*Primary Examiner* — Edward J Glick
*Assistant Examiner* — David Y Chung
(74) *Attorney, Agent, or Firm* — Innovation Counsel LLP

(57) ABSTRACT

A display device includes a first substrate, a second substrate disposed on the first substrate, an image display layer disposed between the first substrate and the second substrate, a gate driver disposed at a first side surface of the first substrate, a data driver disposed at a second side surface of the first substrate, and conductive layers respectively disposed in recesses recessed from the first side surface of the first substrate. The gate driver is electrically connected to the conductive layers.

20 Claims, 22 Drawing Sheets

(56) References Cited

U.S. PATENT DOCUMENTS

| | | | |
|---|---|---|---|
| 10,254,603 B2 | 4/2019 | Kim et al. | |
| 10,488,717 B2 | 11/2019 | Kim et al. | |
| 2010/0097551 A1* | 4/2010 | Yamagishi | G02F 1/13471 |
| | | | 445/24 |
| 2016/0299370 A1* | 10/2016 | Wu | G02F 1/13439 |
| 2017/0343868 A1* | 11/2017 | Kim | G02F 1/1339 |
| 2017/0357121 A1* | 12/2017 | Cho | G02F 1/1368 |
| 2019/0157372 A1* | 5/2019 | Choi | G02F 1/13452 |
| 2019/0223289 A1* | 7/2019 | Kim | H05K 1/189 |
| 2021/0265453 A1* | 8/2021 | Wang | H01L 51/56 |

FOREIGN PATENT DOCUMENTS

| | | | | |
|---|---|---|---|---|
| KR | 10-2017-0065462 A | 6/2017 | | |
| KR | 10-2017-0132954 A | 12/2017 | | |
| KR | 10-2017-0139211 A | 12/2017 | | |
| KR | 10-2018-0070783 A | 6/2018 | | |
| WO | WO-2015079058 A1 * | 6/2015 | ....... | G02F 1/133308 |

\* cited by examiner

DISPLAY DEVICE, MANUFACTURING METHOD THEREOF, AND MULTI-DISPLAY DEVICE

CROSS-REFERENCE TO RELATED APPLICATION(S)

This U.S. non-provisional patent application claims priority under 35 U.S.C. § 119 to Korean Patent Application No. 10-2019-0094568, filed on Aug. 2, 2019; the entire contents of the Korean Patent Application are incorporated by reference.

BACKGROUND

The technical field relates to a display device, a manufacturing method thereof, and a related multi-display device.

In general, a display device includes a display panel including a plurality of pixels for displaying an image, includes a gate driver for providing gate signals to the pixels, and includes a data driver for providing data voltages to the pixels. The gate driver and the data driver are connected to the display panel.

The gate driver generates gate signals and provides the generated gate signals to the pixels. The data driver generates data voltages and provides the generated data voltages to the pixels. The pixels receive the data voltages and display an image in response to the gate signals.

The gate driver and the data driver may be disposed in a bezel area. In general, it is desirable to minimize the bezel area.

SUMMARY

Embodiments may be related to a display device having a narrow bezel, a related manufacturing method, and a related multi-display device.

An embodiment may be related to a display device including the following elements: a first substrate; a second substrate disposed on the first substrate; an image display layer disposed between the first substrate and the second substrate; a gate driver disposed at a first side surface of the first substrate; a data driver disposed at a second side surface of the first substrate; and a plurality of first conductive layers disposed in first recessed portions defined in the first side surface. Here, the gate driver is connected to the first conductive layers.

In an embodiment, a method for manufacturing a display device includes the following steps: defining first recessed portions in a first side surface of a first substrate; defining second recessed portions in a second side surface of a first substrate; providing a plurality of first conductive layers in the first recessed portions; providing a plurality of second conductive layers in the second recessed portions; connecting a gate driver to the first conductive layers; and connecting a data driver to the second conductive layers.

In an embodiment, a multi-display device includes a plurality of display panels connected to each other. Each of the display panels includes the following elements: a first substrate; a second substrate disposed on the first substrate; an image display layer disposed between the first substrate and the second substrate; a gate driver disposed at a first side surface of the first substrate; a data driver disposed at a second side surface of the first substrate; a plurality of first conductive layers disposed in first recessed portions defined in the first side surface; and a plurality of second conductive layers disposed in second recessed portions defined in the second side surface. Also, the gate driver is connected to the first conductive layers, the data driver is connected to the second conductive layers, and a first side surface of a k-th display panel and a first side surface of a k+1-th display panel of the display panels face each other.

An embodiment may be related to a display device. The display device may include a first base substrate, a second base substrate overlapping the first base substrate, an image display layer disposed between the first base substrate and the second base substrate, a gate driver disposed at a first side surface of the first base substrate, a data driver disposed at a second side surface of the first base substrate, and first conductive layers respectively disposed in first recesses recessed from the first side surface of the first base substrate. The gate driver may be electrically connected to the first conductive layers.

The second side surface of the first base substrate may extend lengthwise in a first direction. The first side surface of the first base substrate may extend lengthwise in a second direction different from the first direction. The first recesses may be arranged in the second direction and have respective depths in the first direction.

The display device may include the following elements: gate lines extending lengthwise individually in the first direction, overlapping the first base substrate, and respectively electrically connected to the first conductive layers; data lines extending lengthwise individually in the second direction, electrically insulated from the gate lines, and overlapping the first base substrate; and pixels electrically connected to the gate lines and the data lines.

Each of the first conductive layers may be wider than each of the gate lines in the second direction.

The gate driver may include the following elements: a first flexible circuit board; a first driving chip mounted to the first flexible circuit board; and first pads disposed on the first flexible circuit board, electrically connected to the first driving chip, and respectively electrically connected to the first conductive layers.

The first flexible circuit board may overlap the first side surface of the first base substrate.

The display device may include second conductive layers respectively disposed in second recesses recessed from the second side surface of the first base substrate. The second recesses may be arranged in the first direction and have respective depths in the second direction. The data driver may be electrically connected to the second conductive layers.

The data lines may be respectively electrically connected to the second conductive layers.

The display device may include connection electrodes disposed between the second conductive layers and the data lines to electrically connect the data lines and the second conductive layers.

Each of the second conductive layers and each of the connection electrodes may be wider than each of the data lines in the first direction.

Faces of the connection electrodes may be coplanar with faces of the gate lines.

The data driver may include the following elements: a second flexible circuit board; a second driving chip mounted to the second flexible circuit board; and second pads disposed on the second flexible circuit board, electrically connected to the second driving chip, and respectively electrically connected to the second conductive layers.

The second flexible circuit board may overlap the second side surface of the first base substrate.

An embodiment may be related to a method for manufacturing a display device. The method may include the following steps: preparing first recesses that are recessed from a first side surface of a first base substrate; preparing second recesses that are recessed from a second side surface of the first base substrate; providing first conductive layers in the first recesses, respectively; providing second conductive layers in the second recesses, respectively; electrically connecting a gate driver to the first conductive layers; and electrically connecting a data driver to the second conductive layers.

The preparing of the first and second recesses may include irradiating a laser toward at least one of the first surface of a first base substrate and the second side surface of a first base substrate.

The method may include the following steps: providing gate lines disposed on the first base substrate, each of the gate lines extending in a first direction; providing an insulation layer on the first base substrate to cover the gate lines; and providing data lines on the insulation layer, each of the data lines extending in a second direction different from the first direction. The second side surface of the first base substrate may extend lengthwise in the first direction. The first side surface of the first base substrate may extend lengthwise in the second direction. The first recesses may have respective depths in the first direction. The second recesses may have respective depths in the second direction. The gate lines may be respectively electrically connected to the first conductive layers. The data lines may be respectively electrically connected to the second conductive layers.

The gate driver may include the following elements: a first flexible circuit board; a first driving chip mounted to the first flexible circuit board; and first pads disposed on the first flexible circuit board, electrically connected to the first driving chip, and respectively electrically connected to the first conductive layers. The data driver may include the following elements: a second flexible circuit board; a second driving chip mounted to the second flexible circuit board; and second pads disposed the second flexible circuit board, electrically connected to the second driving chip, and respectively electrically connected to the second conductive layers.

The preparing of the first recesses may include irradiating a first laser toward a first portion of a face of the first base substrate. The first portion of the face of the first base substrate may be adjacent to the first side surface of the first base substrate. The preparing of the second recesses may include irradiating the first laser or a second laser toward a second portion of the face of the first base substrate. The second portion of the face of the first base substrate may be adjacent to the second side surface of the first base substrate.

The method may include the following steps: providing gate lines and connection electrodes on the first base substrate, wherein the gate lines may be respectively electrically connected to the first conductive layers, and wherein the connection electrodes may be respectively electrically connected to the second conductive layers; providing an insulation layer on the first base substrate to cover the gate lines and the connection electrodes; and providing data lines on the insulation layer, wherein the data lines may be respectively electrically connected to the connection electrodes through first contact holes provided in the insulation layer.

An embodiment may be related to a multi-display device that includes a plurality of display panels connected to each other. Each of the display panels may include a first base substrate, a second substrate overlapping the first base substrate, an image display layer disposed between the first base substrate and the second base substrate, a gate driver disposed at a first side surface of the first base substrate, a data driver disposed at a second side surface of the first base substrate, first conductive layers respectively disposed in first recesses recessed from the first side surface, and second conductive layers respectively disposed in second recesses recessed from the second side surface. The gate driver may be electrically connected to the first conductive layers. The data driver may be electrically connected to the second conductive layers. The first side surfaces of the first base substrates of two immediately neighboring ones of the display panels may face each other.

DETAILED DESCRIPTION

Figure 1:
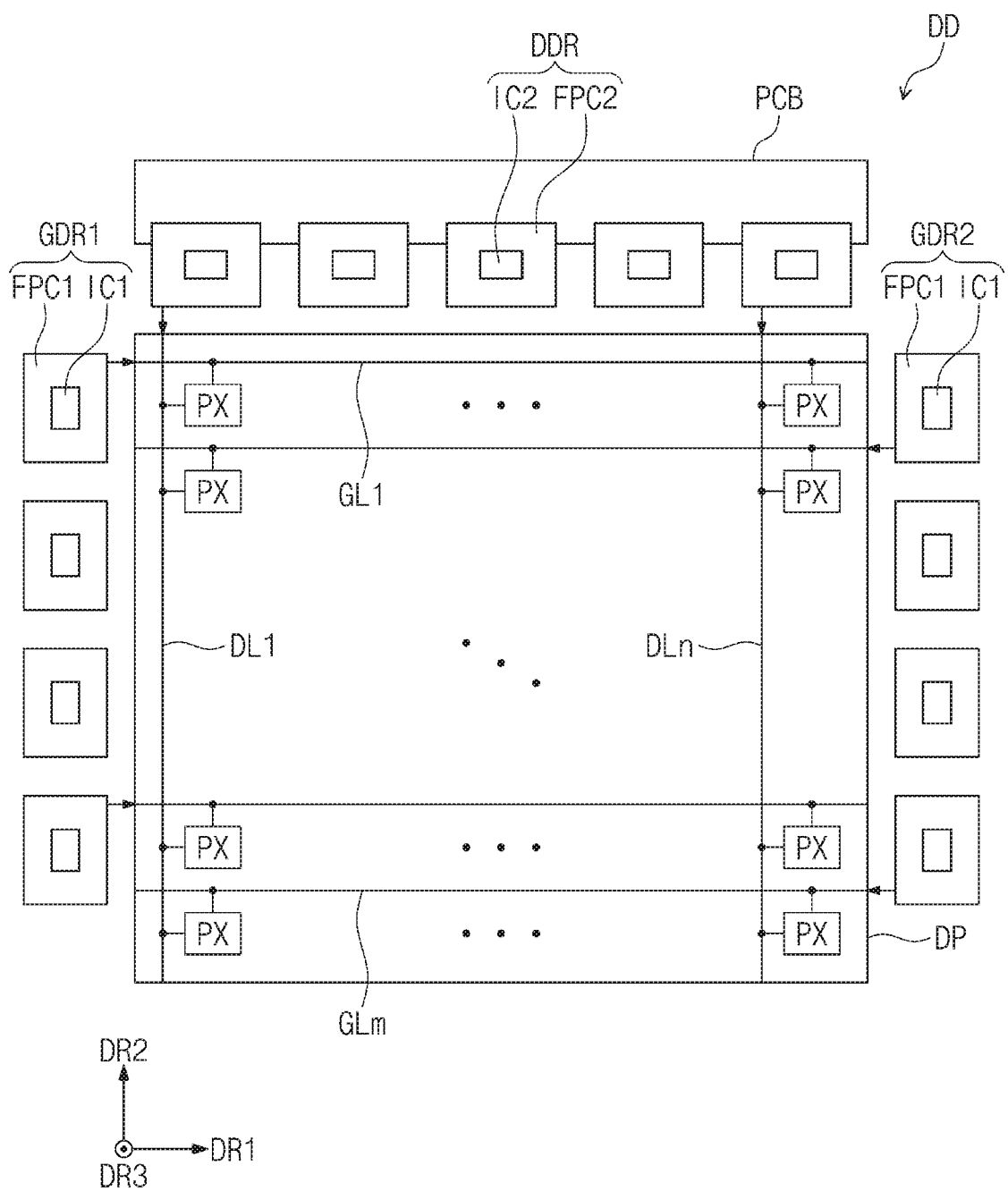
FIG. 1 is a plan view illustrating a display device according to an embodiment.

Example embodiments are described with reference to the accompanying figures. The figures are part of the specification of this application.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

When a first element is referred to as being 'on,' 'connected to,' or 'coupled to,' a second element, the first element can be directly disposed/connected/coupled on/to the second element, or an intervening element may be present between the first element and the second element.

Like reference numerals may refer to like elements. In the figures, ratios and/or dimensions of components may be exaggerated for clarity of illustration.

A singular form may include plural forms unless referred to the contrary.

Unless otherwise defined, all terms (including technical and scientific terms) used herein have the same meanings as generally understood by those skilled in the art. Terms as defined in a commonly used dictionary should be construed as having the same meanings as in an associated technical contexts The term "connect" may mean "electrically connect." The term "insulate" may mean "electrically insulate" or "electrically isolate." The term "extend" may mean "extend lengthwise" or "be lengthwise." The term "recessed portion" may mean "recess." The term "contact" may mean "directly contact."

FIG. 1 is a plan view illustrating a display device according to an embodiment.

Referring to FIG. 1, a display device DD may include a display panel DP, gate drivers GDR1 and GDR2, a data driver DDR, and a printed circuit board PCB. The display panel DP may have a rectangular shape having long sides extending in a first direction DR1 and short sides extending in a second direction DR2 crossing the first direction DR1. The display device DD may have one or more other shapes.

Hereinafter, a direction that is substantially perpendicular to a plane defined by the directions DR1 and DR2 is defined as a third direction DR3. In this specification, a plan view may represent a view in the third direction DR3.

The display panel DP may be a liquid crystal display panel including a liquid crystal layer. The display panel DP may be an electrophoretic display panel including an electrophoretic layer or an electrowetting display panel including an electrowetting layer. Each of the liquid crystal layer, the electrophoretic layer, and the electrowetting layer may be an image display layer.

The display panel DP may include a plurality of pixels PX, a plurality of gate lines GL1 to GLm, and a plurality of data lines DL1 to DLn. Here, reference numerals m and n are natural numbers. The gate lines GL1 to GLm may cross the data lines DL1 to DLn and may be insulated from the data lines DL1 to DLn.

The pixels PX are connected to the gate lines GL1 to GLm and the data lines DL1 to DLn. Each of the pixels PX may display one of primary colors. The primary colors may include red, green, blue, and white. The primary colors may include yellow, cyan, and magenta.

Each of the gate lines GL1 to GLm may extend in the first direction DR1, and each of the data lines DL1 to DLn may extend in the second direction DR2. The gate drivers GDR1 and GDR2 may be connected to the display panel DP and connected to the gate lines GL1 to GLm. The data driver DDR may be connected to the display panel DP and then connected to the data lines DL1 to DLn.

In order to illustrate a plan view of the gate drivers GDR1 and GDR2 and the data driver DDR, the gate drivers GDR1 and GDR2 and the data driver DDR are separately illustrated for convenience. The gate drivers GDR1 and GDR2 and the data driver DDR may be connected to the display panel DP.

The gate drivers GDR1 and GDR2 may include a first gate driver GDR1 and a second gate driver GDR2, which are respectively adjacent to two sides of the display panel DP that are opposite each other in the first direction DR1. The gate drivers GDR1 and GDR2 may be adjacent to the short sides of the display panel DP, respectively.

The first gate driver GDR1 may be connected to odd-numbered gate lines of the gate lines GL1 to GLm. The second gate driver GDR2 may be connected to even-numbered gate lines of the gate lines GL1 to GLm.

Two gate drivers GDR1 and GDR2 are illustrated. In an embodiment, one gate driver may be disposed at one side of the display panel DP and connected to the gate lines GL1 to GLm.

Each of the gate drivers GDR1 and GDR2 may include first flexible circuit boards FPC1 and first driving chips IC1 mounted to the first flexible circuit boards FPC1, respectively. The first driving chips IC1 may be connected to the display panel DP through the first flexible circuit boards FPC1.

The first driving chips IC1 of the first gate driver GDR1 may be connected to the odd-numbered gate lines through the first flexible circuit boards FPC1 of the first gate driver GDR1. The first driving chips IC1 of the second gate driver GDR2 may be connected to the even-numbered gate lines through the first flexible circuit boards FPC1 of the second gate driver GDR2.

Each of the first and second gate drivers GDR1 and GDR2 includes four first driving chips IC1 and four first flexible circuit boards FPC1 in FIG. 1. The number of the first driving chips IC1 and the number of the first flexible circuit boards FPC1 may be configured according to a size of the display panel DP.

The data driver DDR may be adjacent to one side of the display panel DP that is lengthwise in the first direction DR1. The data driver DDR may be adjacent to one of the long sides of the display panel DP.

The data driver DDR may include second flexible circuit boards FPC2 and second driving chips IC2 mounted to the second flexible circuit boards FPC2, respectively. The second driving chips IC2 may be connected to the display panel DP through the second flexible circuit boards FPC2.

Five second driving chips IC2 and five second flexible circuit boards FPC2 are illustrated in FIG. 1. The number of the second driving chips IC2 and the number of the second flexible circuit boards FPC2 may be configured according to the size of the display panel DP.

The second flexible circuit boards FPC2 may be connected to the printed circuit board PCB. The second driving chips IC2 may be connected to the printed circuit board PCB through the second flexible circuit boards FPC2.

A timing controller (not shown) may be disposed on the printed circuit board PCB. The timing controller may have/be an integrated circuit chip and may be mounted on the printed circuit board PCB. The timing controller may be connected to the gate drivers GDR1 and GDR2 and to the data driver DDR. The timing controller may output a gate control signal, a data control signal, and image data.

The gate drivers GDR1 and GDR2 may receive the gate control signal from the timing controller and generate a plurality of gate signals in response to the gate control signal. The gate signals may be outputted in order. The gate signals may be provided to the pixels PX through the gate lines GL1 to GLm.

The data driver DDR may receive the image data and the data control signal from the timing controller. The data driver DDR generates analog type data voltages corresponding to the image data in response to the data control signal. The data voltages may be provided to the pixels PX through the data lines DL1 to DLn.

The pixels PX may receive the data voltages through the data lines DL1 to DLn in response to the gate signals provided through the gate lines GL1 to GLm. The pixels PX may display an image by displaying a gradation corresponding to the data voltages.

Figure 2:
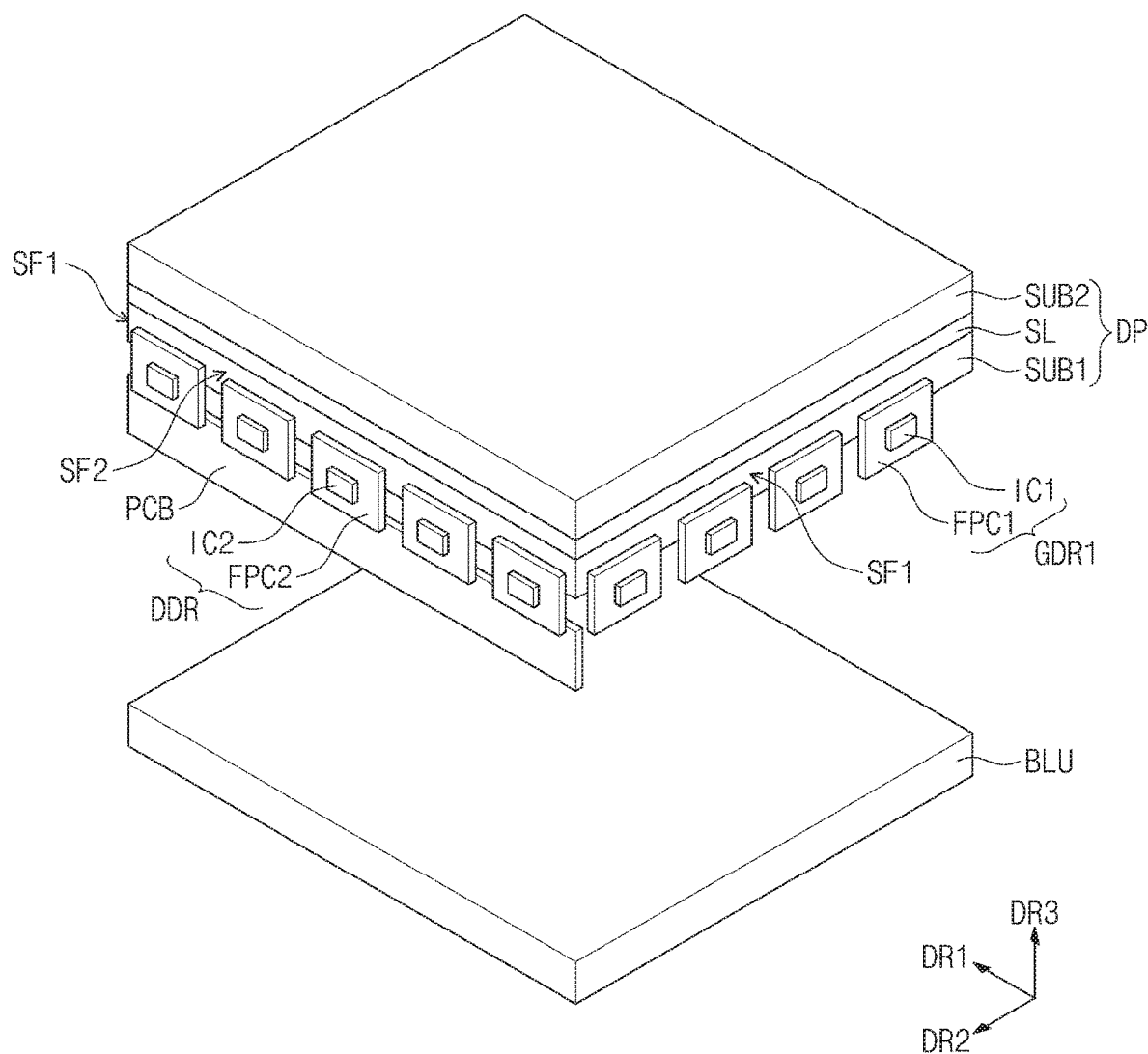
FIG. 2 is a perspective view illustrating the display device in FIG. 1 according to an embodiment.

FIG. 2 is a perspective view illustrating the display device in FIG. 1 according to an embodiment.

Referring to FIG. 2, the display panel DP may include a first substrate, a second substrate SUB2, and an encapsulation layer SL disposed between the first substrate SUB1 and the second substrate SUB2. Each of the first substrate SUB1 and the second substrate SUB2 may have a rectangular shape having long sides in the first direction DR1 and short sides in the second direction DR2. The encapsulation layer SL may extend at edges of each of the first substrate SUB1 and the second substrate SUB2 to bond the first substrate SUB1 and the second substrate SUB2 to each other.

The display device DD may include a backlight unit BLU disposed below the display panel DP. The backlight unit BLU may generate light and provide the generated light to the display panel DP. The pixels PX of the display panel DP may display an image using the light provided from the backlight unit BLU.

Each of the gate drivers GDR1 and GDR2 may be disposed at a side surface of the display panel DP. For example, the first and second gate drivers GDR1 and GDR2 may be disposed at two side surfaces of the first substrate SUB1 that are opposite each other in the first direction DR1. The first gate driver GDR1 disposed at one side of the first substrate SUB1 is illustrated in the perspective view, the second gate driver GDR2 may be disposed at the other side of the first substrate SUB1.

The side surfaces of the first substrate SUB1 at which the gate drivers GDR1 and GDR2 are disposed may be defined as first side surfaces SF1. The first side surfaces SF1 may be short sides of the first substrate SUB1. Each of the first side surfaces SF1 may extend in the second direction DR2.

The data driver DDR may be disposed at another side surface of the display panel DP. For example, the data driver DDR may be disposed at one side surface of the first substrate SUB1 that is lengthwise in the first direction DR1. The side surface of the first substrate SUB1 at which the data driver DDR is disposed is defined as a second side surface SF2. The second side surface SF2 may be one of the long sides of the first substrate SUB1.

The gate drivers GDR1 and GDR2 may be connected to the first side surfaces SF1, respectively. The data driver DDR may be connected to the second side surface SF2.

Figure 3:
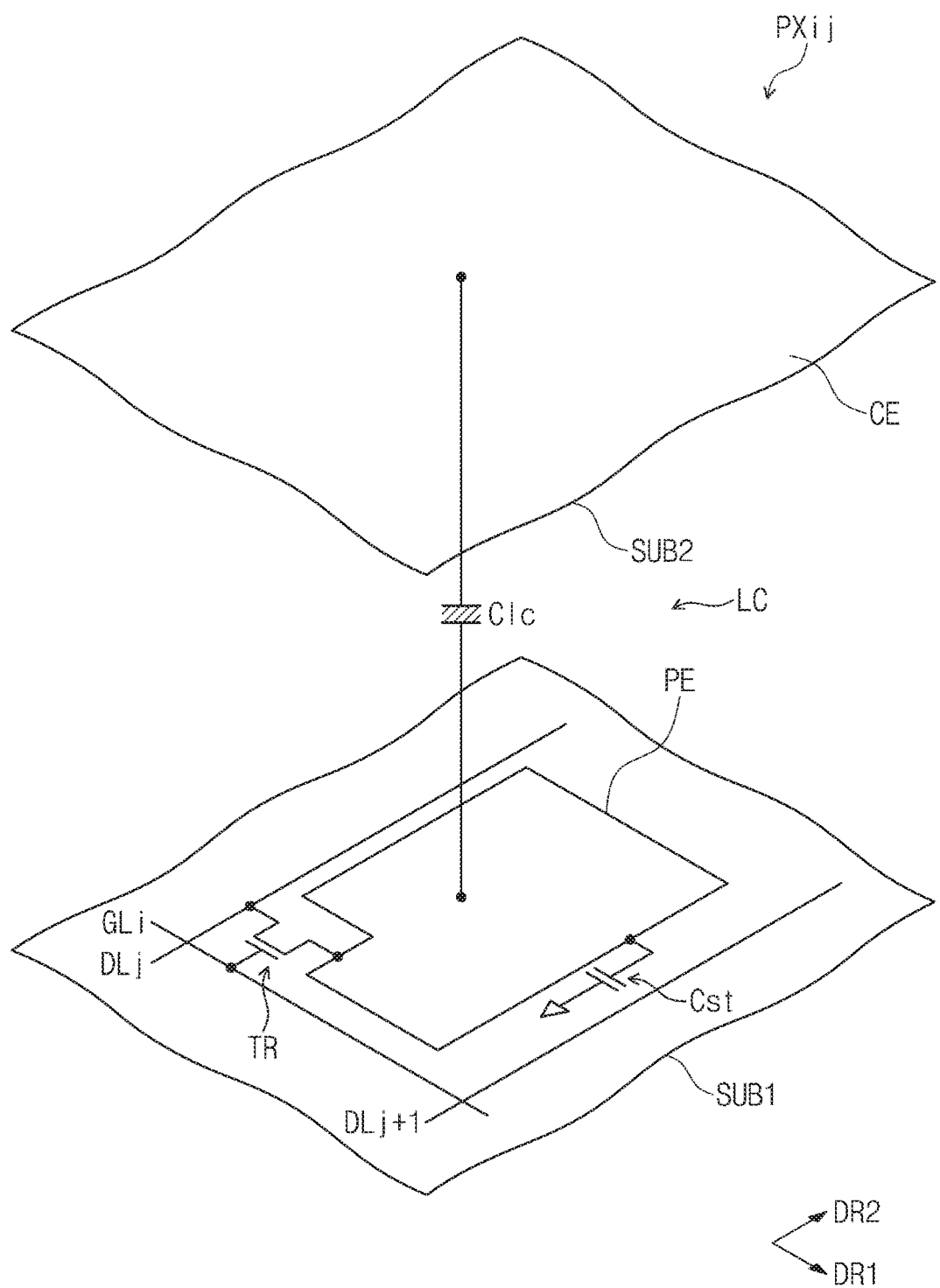
FIG. 3 is a view illustrating a configuration of one pixel in FIG. 1 according to an embodiment.

FIG. 3 is a view illustrating a configuration of one pixel in FIG. 1 according to an embodiment.

For example, a pixel PXij connected to a gate line GLi and a data line DLj is illustrated in FIG. 3. A configuration of each of other pixels PX of the display panel DP may be the same as that of the pixel PXij in FIG. 3.

Referring to FIG. 3, the first substrate SUB1 may include the gate line GLi, the data line DLj, and the pixel PXij connected to the gate line GLi and the data line DLj. Specifically, the pixel PXij may include a transistor TR connected to the gate line GLi and the data line DLj, a liquid crystal capacitor Clc connected to the transistor TR, and a storage capacitor Cst connected in parallel to the liquid crystal capacitor Clc. The storage capacitor Cst may be omitted. Here, reference symbols i and j are natural numbers.

The transistor TR may include a gate electrode (not shown) connected to the gate line GLi, a source electrode (not shown) connected to the data line DLj, and a drain electrode (not shown) connected to the liquid crystal capacitor Clc and the storage capacitor Cst.

The liquid crystal capacitor Clc may include a pixel electrode PE disposed on the first substrate SUB1 and connected to the transistor TR, a common electrode CE disposed on the second substrate SUB2, and a liquid crystal layer LC disposed between the pixel electrode PE and the common electrode CE. The liquid crystal layer LC may serve as a dielectric substance.

The pixel electrode PE has a non-slit structure in FIG. 3. In an embodiment, the pixel electrode PE may have a slit structure including a stem part having a cross-shape and a plurality of branches radially extending from the stem part. The common electrode CE may be disposed over the entire second substrate SUB2.

The storage capacitor Cst may include a pixel electrode PE, a storage electrode (not shown) branched from a storage line (not shown), and an insulation layer disposed between the pixel electrode PE and the storage electrode. The storage line may be disposed on the first substrate SUB1 and simultaneously provided on the same layer as the gate lines GL1 to GLm. The storage electrode may partially overlap the pixel electrode PE.

The pixel PXij may further include a color filter CF representing one of red, green, and blue. The color filter CF will be illustrated below in FIG. 4.

The transistor TR may be turned on in response to a gate signal provided through the gate line GLi. The data voltage received through the data line DLj may be provided to the pixel electrode PE of the liquid crystal capacitor Clc through the turned-on transistor TR. A common voltage may be applied to the common electrode CE.

An electric field may be provided between the pixel electrode PE and the common electrode CE due to a difference between voltage levels of the data voltage and the common voltage. Liquid crystal molecules of the liquid crystal layer LC may be driven by the electric field provided between the pixel electrode PE and the common electrode CE. As a light transmittance is adjusted by the liquid crystal molecules driven by the electric field, an image may be displayed.

A storage voltage having a predetermined voltage level may be applied to the storage line. In an embodiment, the common voltage may be applied to the storage line. The storage capacitor Cst may serve to complement a charge amount of the liquid crystal capacitor Clc.

Figure 4:
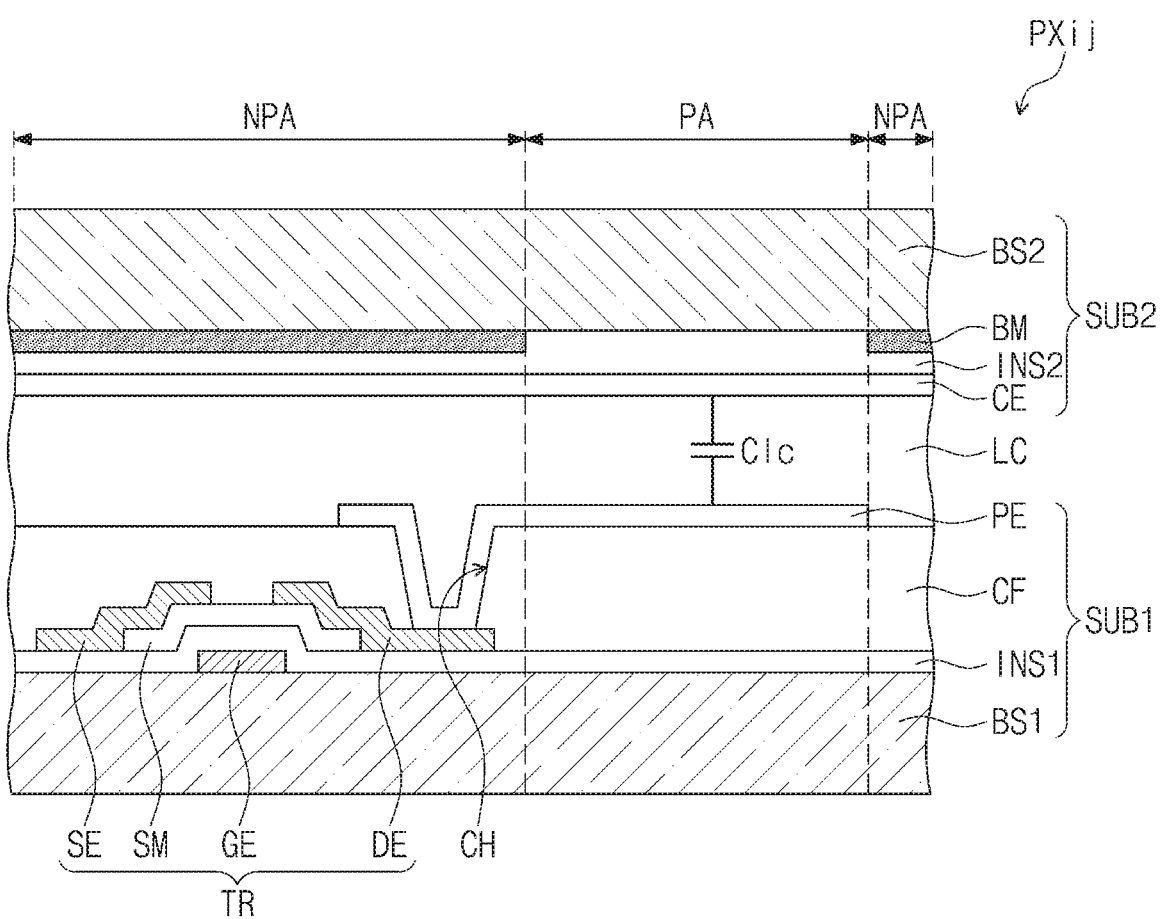
FIG. 4 is a schematic view illustrating a cross-section of the pixel in FIG. 3 according to an embodiment.

FIG. 4 is a schematic view illustrating a cross-section of the pixel in FIG. 3 according to an embodiment.

For convenience of description, a configuration of the storage capacitor is omitted in FIG. 4.

Referring to FIG. 4, the first substrate SUB1 may include a first base substrate BS1, a transistor TR, a color filter CF, and a pixel electrode PE. A planar area of the pixel PXij may include a pixel area PA1 and a non-pixel area NPA around the pixel area PA. The transistor TR may be disposed in the non-pixel area NPA, and the pixel electrode PE may overlap the pixel area PA.

The first base substrate BS1 may be a transparent or opaque insulation substrate. For example, the first base substrate S1 may include a silicon substrate, a glass substrate, or a plastic substrate.

A gate electrode GE of the transistor TR may be disposed on the first base substrate BS1. The gate electrode GE may be substantially branched from the gate line GLi. A first insulation layer INS1 may be disposed on the first base substrate BS1 to cover the gate electrode GE. The first insulation layer INS1 may be defined as a gate insulation layer. The first insulation layer INS1 may be an inorganic insulation layer containing an inorganic material.

A semiconductor layer SM of the transistor TR may be disposed on the first insulation layer INS1 covering the gate electrode GE. Although not shown, the semiconductor layer SM may include an active layer and an ohmic contact layer.

A source electrode SE and a drain electrode DE of the transistor TR may be spaced apart from each other on the semiconductor layer SM and the first insulation layer INS1. The semiconductor layer SM may provide a conductive channel between the source electrode SE and the drain electrode DE.

A color filter CF may be disposed on the first insulation layer INS1 to cover the source electrode SE and the drain electrode DE. The source electrode SE may be substantially branched from the data line DLj.

Although not shown, a passivation layer may be disposed on the first insulation layer INS1 to cover the source electrode SE and the drain electrode DE. The passivation layer may be an inorganic insulation layer containing an inorganic material. The color filter CF may be disposed on the passivation layer. A contact hole CH exposing a predetermined area of the drain electrode DE may be defined in the color filter CF.

In the pixel area PA, the pixel electrode PE may be disposed on the color filter CF. The pixel electrode PE may extend to the non-pixel area NPA and be electrically connected to the drain electrode DE through the contact hole CH.

A liquid crystal layer LC may be disposed between the first substrate SUB1 and the second substrate SUB2. The second substrate SUB2 may include a second base substrate BS2, a black matrix BM, a second insulation layer INS2, and a common electrode CE. The second base substrate BS2 may contain the same material as the first base substrate BS1.

In the non-pixel area NPA, the black matrix BM may be disposed below the second base substrate BS2. The second insulation layer INS2 may be disposed below the second base substrate BS2 to cover the black matrix BM. The common electrode CE may be disposed below the second insulation layer INS2.

The liquid crystal capacitor Clc may include a pixel electrode PE, a common electrode CE facing the pixel electrode PE, and a liquid crystal layer LC disposed between the pixel electrode PE and the common electrode CE.

Figure 5:
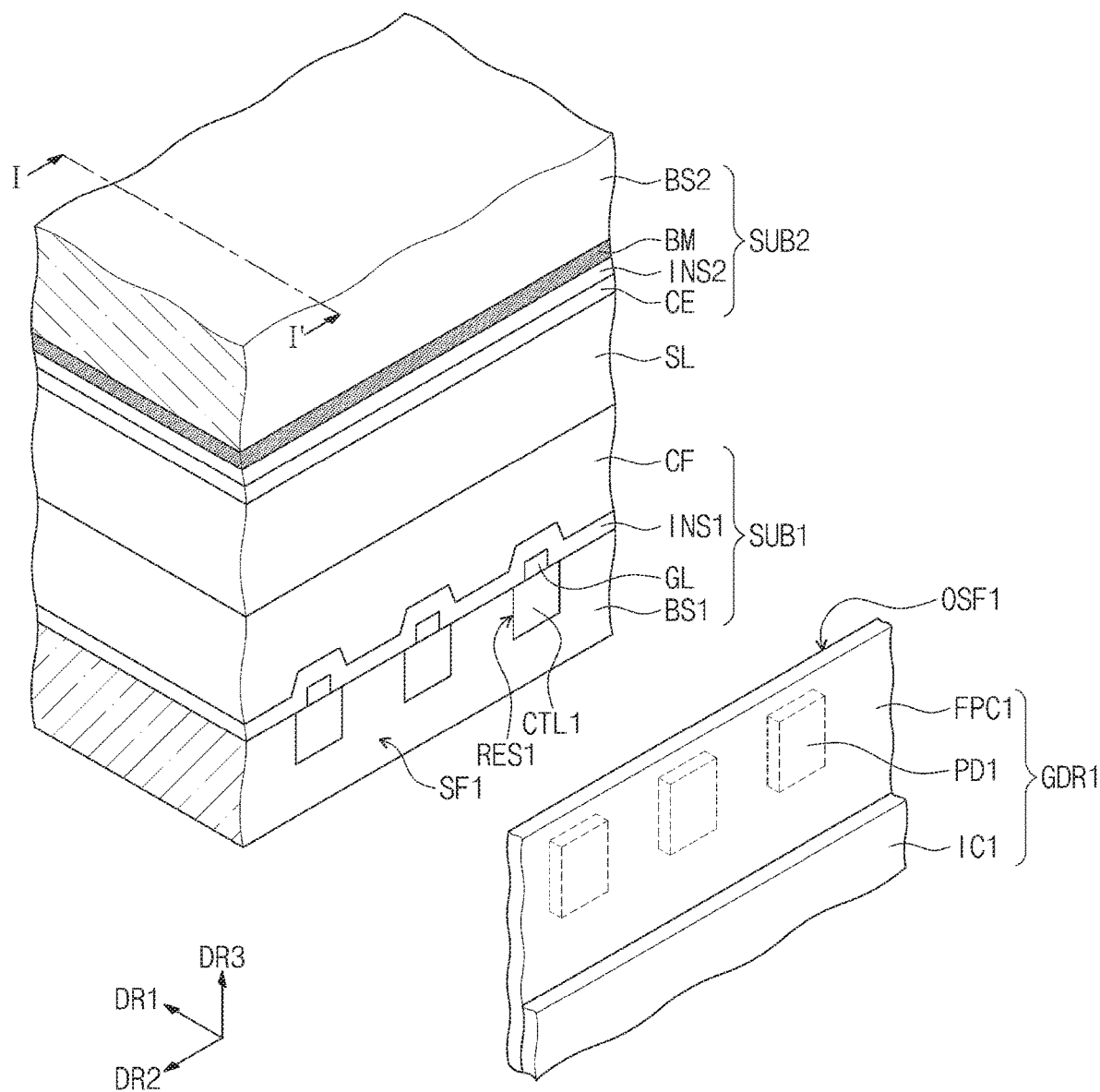
FIG. 5 is a view illustrating a portion of a first side surface on which a first gate driver is disposed according to an embodiment.

FIG. 5 is a view illustrating a portion of a first side surface on which a first gate driver is disposed according to an embodiment.

Referring to FIG. 5, each of the gate lines GL may extend in the first direction DR1 until the first side surface SF1 of the first substrate SUB1. The gate lines GL in FIG. 5 may be some of the gate lines GL1 to GLm.

First recessed portions RES1 may be recessed from (or recessed relative to) the first side surface SF1 of the first substrate SUB1. First conductive layers CTL1 may be respectively disposed inside the first recessed portions RES1. The first side surface SF1 of the first substrate SUB1 may be a first side surface SF1 of the first base substrate BS1. The first recessed portions RES1 may be recessed from the first side surface SF1 of the first base substrate BS1.

The first recessed portions RES1 may be arranged in the second direction DR2. The first recessed portions RES1 may be positioned between the gate lines GL and portions of the first base substrate BS1. The first conductive layers CTL1 disposed in the first recessed portions RES1 may respectively contact the gate lines GL. Thus, the gate lines GL may be respectively electrically connected to the first conductive layers CTL1. In the second direction DR2, each of the first conductive layers CTL1 may have a width greater than a width of each of the gate lines GL.

A first flexible circuit board FPC1 of the first gate driver GDR1 may face the first side surface SF1. The first gate driver GDR1 may include a plurality of first pads PD1 disposed on one surface OSF1 of the first flexible circuit board FPC1 facing the first side surface SF1. Each of the first pads PD1 may contain a conductive material.

The first pads PD1 may be arranged in the second direction DR2. In the first direction DR1, the first pads PD1 may respectively overlap the first conductive layers CTL1 and may respectively overlap the gate lines GL. A first driving chip IC1 may be disposed on a surface of the first flexible circuit board FPC1 opposite the one surface OSF1 of the first flexible circuit board FPC1.

Figure 6:
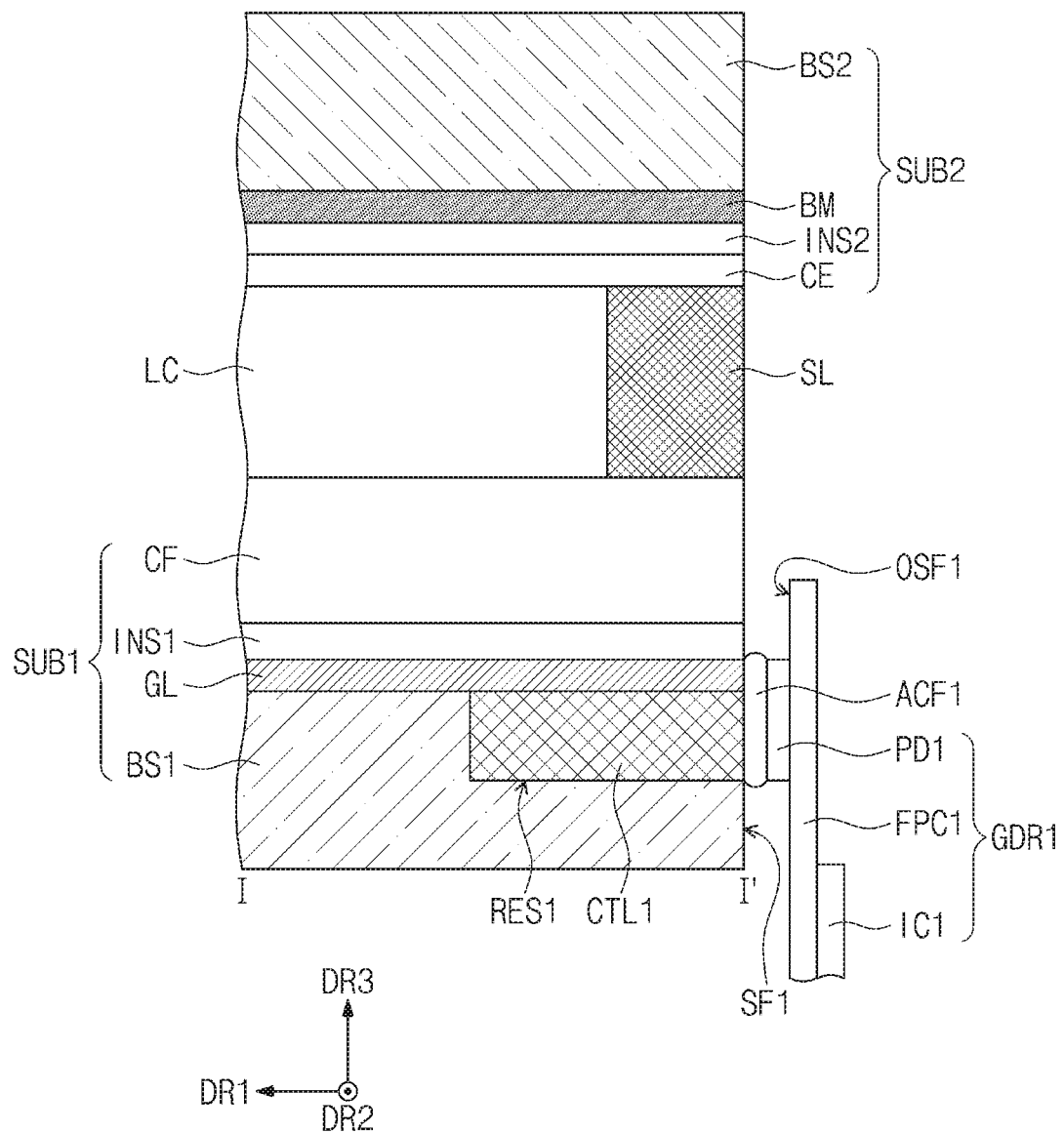
FIG. 6 is a cross-sectional view taken along line I-I' of FIG. 5 according to an embodiment.
Figure 7:
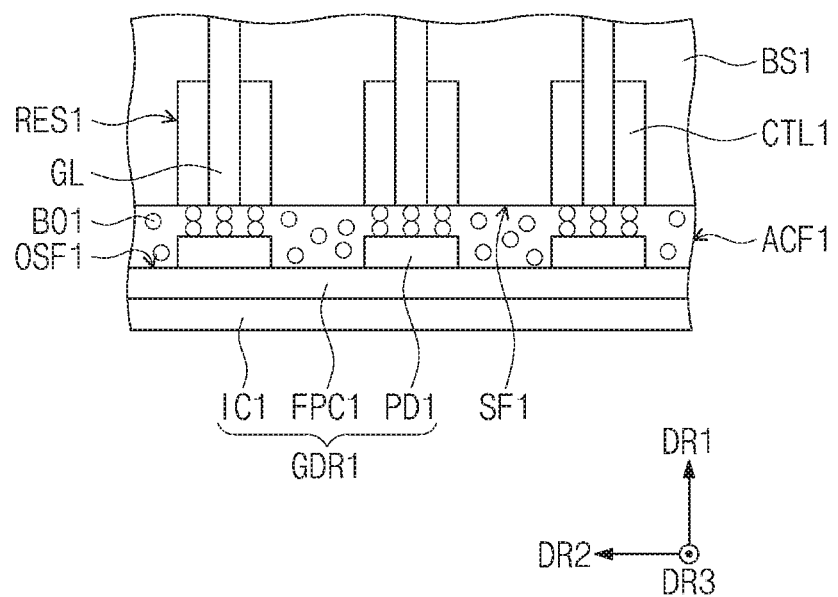
FIG. 7 is a view illustrating a connection state between first pads and first conductive layers according to an embodiment.

FIG. 6 is a cross-sectional view taken along line I-I' of FIG. 5 according to an embodiment. FIG. 7 is a view illustrating connections between the first pads and the first conductive layers in the third direction according to an embodiment.

Referring to FIG. 6, the encapsulation layer SL may be disposed between an edge of the first substrate SUB1 and an edge of the second substrate SUB2 to bond the first substrate SUB1 and the second substrate SUB2. The liquid crystal layer LC may be accommodated between the first substrate SUB1 and the second substrate SUB2 by the encapsulation layer SL.

A first recessed portion RES1 may be recessed in the first direction DR1 from the first side surface SF1. A lower portion of the corresponding gate line GL may be exposed by the first recessed portion RES1. As the first conductive layer CTL1 is disposed in the first recessed portion RES1, the first conductive layer CTL1 may contact the lower portion of the gate line GL. Thus, the first conductive layer CTL1 may be electrically connected to the gate line GL.

The first pad PD1 may be connected to the first driving chip IC1. Although not shown, lines connected to the first driving chip IC1 may be connected to the first pad PD1 through via-holes positioned in the first flexible circuit board FPC1.

The first pad PD1 may be electrically connected to the first conductive layer CTL1 and the gate line GL. A first anisotropic conductive film ACF1 may be disposed between the first pad PD1 and the first conductive layer CTL1 and between the first pad PD1 and the gate line GL.

The first pad PD1 and the first conductive layer CTL1 may be electrically connected by the first anisotropic conductive film ACF1, and the first pad PD1 and the gate line GL may be electrically connected by the first anisotropic conductive film ACF1. The first pad PD1 may be electrically connected to the gate line GL through the first conductive layer CTL1.

Referring to FIG. 7, the first anisotropic conductive film ACF1 may be disposed between the first pads PD1 and the first conductive layers CTL1 and between the first pads PD1 and the gate lines GL, and the first flexible circuit board FPC1 may be pressed toward the first side surface SF1.

As a pressing operation is performed, conductive balls BO1 of the first anisotropic conductive film ACF1 disposed between the first pads PD1 and the first conductive layers CTL1 may contact each other to electrically connect the first pads PD1 to the first conductive layers CTL1. Conductive balls BO1 disposed between the first pads PD1 and the gate lines GL may contact each other to electrically connect the first pads PD1 to the gate lines GL.

Referring to FIGS. 6 and 7, as the first flexible circuit board FPC1 is connected to the first conductive layers CTL1 through the first pads PD1, the first gate driver GDR1 may be connected to the first conductive layers CTL1. Analogously, the second gate driver GDR2 may be connected to the first conductive layers disposed in first recessed portions recessed from another first side surface SF1.

The first flexible circuit board FPC1 may be disposed parallel to the first side surface SF1. As the first gate driver GDR1 is connected to the first side surface SF1, the first flexible circuit board FPC1 may be perpendicular to a top surface of the first substrate SUB1. The first flexible circuit board FPC1 may have face on a plane defined by the directions DR2 and DR3.

If the first flexible circuit board FPC1 is disposed parallel to the top surface of the first substrate SUB1 and connected to the top surface of the first substrate SUB1, which is adjacent to one side of the first substrate SUB1, an area required for the gate drivers GDR1 and GDR2 in a plan view of the display device DD may be undesirably large. In an embodiment, since the gate drivers GDR1 and GDR2 are connected to the first side surfaces SF1 of the first substrate SUB1, the area required for the gate drivers GDR1 and GDR2 may be minimized in the plan view of the display device DD.

Figure 8:
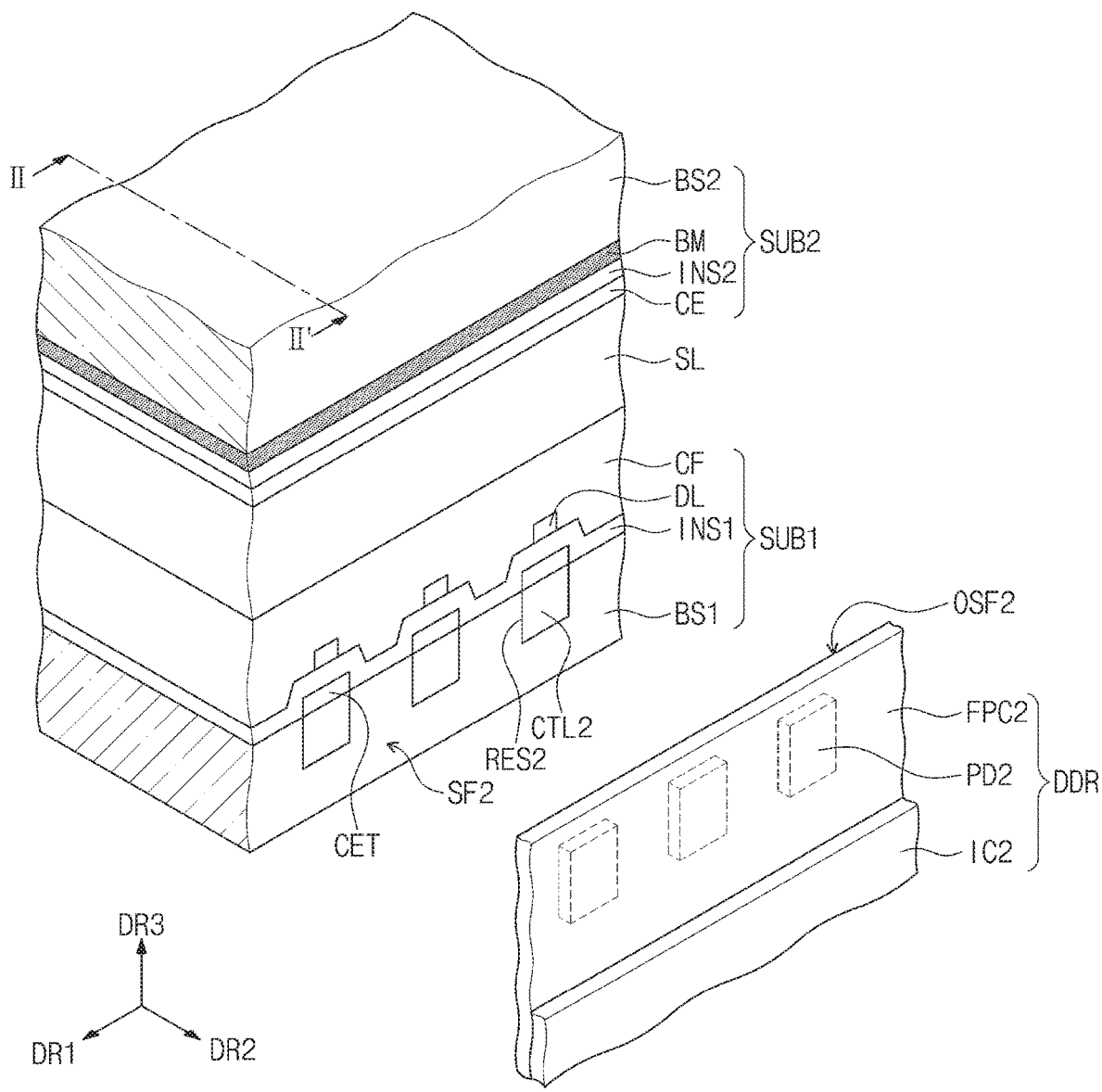
FIG. 8 is a view illustrating a portion of a second side surface on which a data driver is disposed according to an embodiment.

FIG. 8 is a view illustrating a portion of a second side surface on which a data driver is disposed according to an embodiment.

Referring to FIG. 8, the data lines DL may extend in the second direction DR2 to the second side surface SF2 of the first substrate SUB1. The data lines DL in FIG. 8 may be some of the data lines DL1 to DLn.

Second recessed portions RES2 may be recessed from (or recessed relative to) the second side surface SF2 of the first substrate SUB1. Second conductive layers CTL2 may be respectively disposed inside the second recessed portions RES2. The second side surface SF2 of the first substrate SUB1 may be a second side surface SF2 of the first base substrate BS1. The second recessed portions RES2 may be recessed from the second side surface SF2 of the first base substrate BS1.

The second recessed portions RES2 may be arranged in the first direction DR1. The second recessed portions RES2 may be positioned between the data lines DL and portions of the first base substrate BS1. In the first direction DR1, each of the second conductive layers CTL2 may have a width greater than a width of each of the data lines DL.

The second conductive layers CTL2 may be respectively electrically connected to the data lines DL. For example, connection electrodes CET may be respectively disposed between the second conductive layers CTL2 and the data lines DL. The connection electrodes CET may be disposed on the same layer as the gate lines GL, such that faces of the connection electrodes CET may be coplanar with faces of the gate lines GL. The second conductive layers CTL2 may be electrically connected to the data lines DL by the connection electrodes CET through contact holes.

In the first direction DR1, each of the connection electrodes CET may have a width greater than a width of each of the data lines DL. In the first direction DR1, each of the connection electrodes CET may have the same width as each of the second conductive layers CTL2. In an embodiment, in the first direction DR1, each of the connection electrodes CET may have a width greater or less than a width of each of the second conductive layers CTL2.

A second flexible circuit board FPC2 of the data driver DDR may face the second side surface SF2. The data driver DDR may include a plurality of second pads PD2 disposed on one surface OSF2 of the second flexible circuit board FPC2 facing the second side surface SF2. Each of the second pads PD2 may contain a conductive material.

The second pads PD2 may be arranged in the first direction DR1. In the second direction DR2, the second pads PD2 may respectively overlap the second conductive layers CTL2 and may respectively overlap the connection electrodes CET. A second driving chip IC2 may be disposed on a surface of the second flexible circuit board FPC2 opposite the one surface OSF2 of the second flexible circuit board FPC2.

Figure 9:
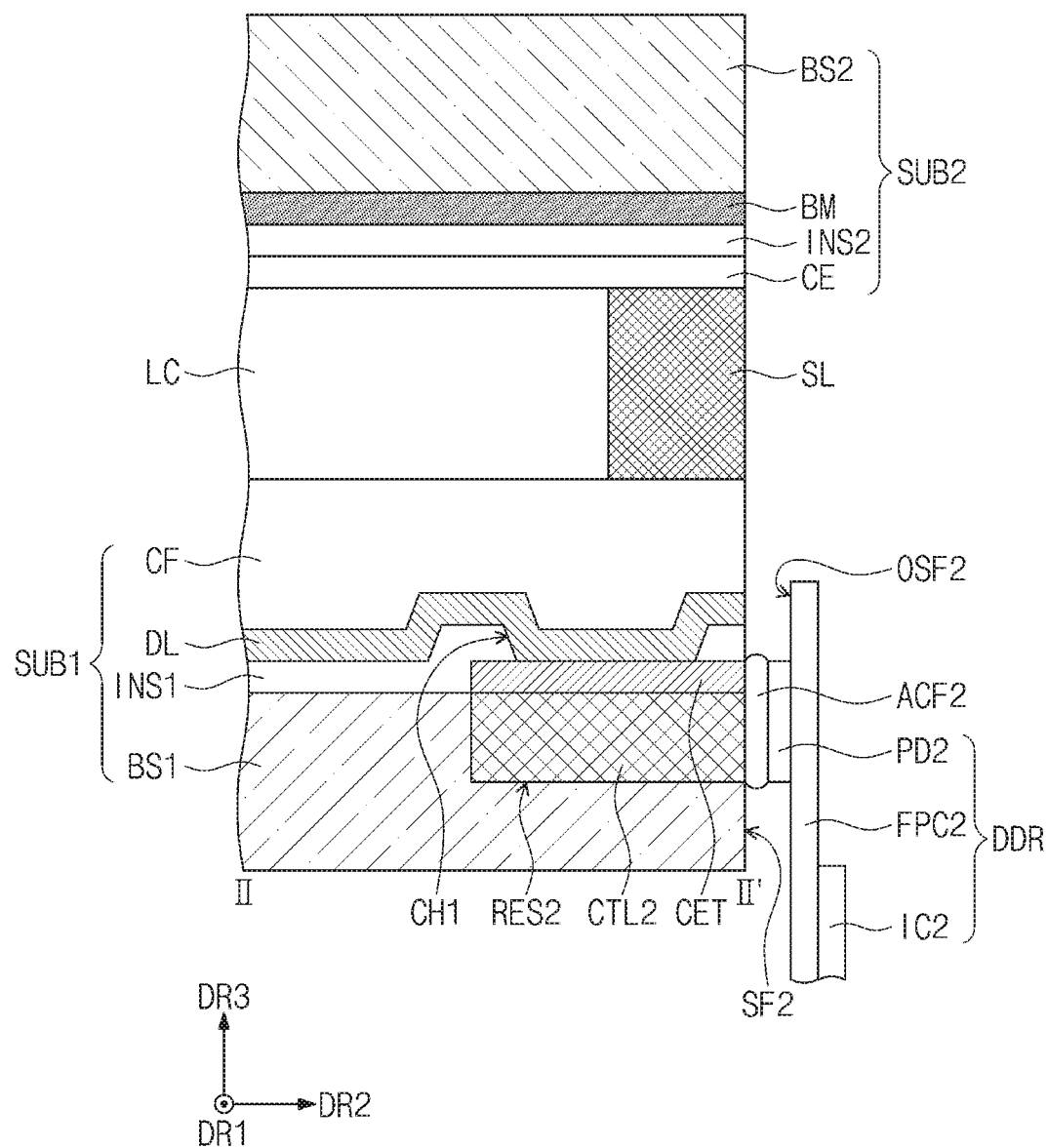
FIG. 9 is a cross-sectional view taken along line II-II' of FIG. 8 according to an embodiment.
Figure 10:
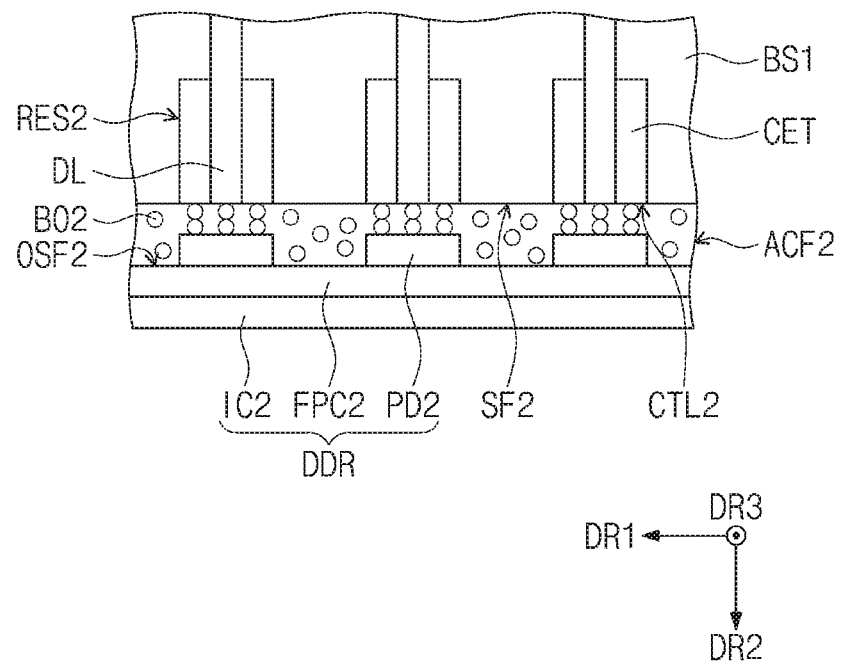
FIG. 10 is a view illustrating a connection state between second pads and second conductive layers according to an embodiment.

FIG. 9 is a cross-sectional view taken along line II-II' of FIG. 8 according to an embodiment. FIG. 10 is a view illustrating connections between the second pads and the second conductive layers in the third direction according to an embodiment.

Referring to FIG. 9, a second recessed portion RES2 may be recessed in the second direction DR2 from the second side surface SF2. A lower portion of the corresponding connection electrode CET may be exposed by the second recessed portion RES2. As the corresponding second conductive layer CTL2 is disposed in the second recessed portion RES2, the connection electrode CET may be disposed directly on the second conductive layer CTL2.

The second conductive layer CTL2 may contact the lower portion of the connection electrode CET. Thus, the second conductive layer CTL2 may be electrically connected to the connection electrode CET. The connection electrode CET may overlap the second conductive layer CTL2 in the third direction DR3.

The first insulation layer INS1 may be disposed on the first base substrate BS1 to cover the connection electrode CET. The data lines DL correspond to the connection electrode CET may be disposed on the first insulation layer INS1. A first contact hole CH1 for exposing a predetermined portion of the connection electrode CET may be positioned in the first insulation layer INS1. The data line DL may be electrically connected to the connection electrode CET through the first contact hole CH1. Thus, the data line DL may be electrically connected to the second conductive layer CTL2 through the connection electrode CET.

The corresponding second pad PD2 may be connected to the second driving chip IC2. Although not shown, lines connected to the second driving chip IC2 may be connected to the second pad PD2 through via-holes positioned in the second flexible circuit board FPC2.

The second pad PD2 may be electrically connected to the second conductive layer CTL2 and the connection electrode CET. A second anisotropic conductive film ACF2 may be disposed between the second pad PD2 and the second conductive layer CTL2 and between the second pad PD2 and the connection electrode CET.

The second pad PD2 and the second conductive layer CTL2 may be electrically connected by the second anisotropic conductive film ACF2, and the second pad PD2 and the connection electrode CET may be electrically connected by the second anisotropic conductive film ACF2. The second pad PD2 may be electrically connected to the data line DL through the second conductive layer CTL2 and the connection electrode CET.

Referring to FIG. 10, the second anisotropic conductive film ACF2 may be disposed between the second pads PD2 and the second conductive layers CTL2 and between the second pads PD2 and the connection electrodes CET, and the second flexible circuit board FPC2 may be pressed toward the second side surface SF2.

The second pads PD2 may be electrically connected to the second conductive layers CTL2 by conductive balls BO2, which contact each other as the pressing operation is performed, and the second pads PD2 may be electrically connected to the connection electrodes CET by other conductive balls BO2.

Referring to FIGS. 9 and 10, as the second flexible circuit board FPC2 is connected to the second conductive layers CTL2 through the second pads PD2, the data driver DDR may be connected to the second conductive layers CTL2.

The second flexible circuit board FPC2 may be disposed parallel to the second side surface SF2. As the data driver DDR is connected to the second side surface SF2, the second flexible circuit board FPC2 may extend perpendicular to the top face of the first substrate SUB1. The second flexible circuit board FPC2 may have a face on plane defined by the directions DR1 and DR3.

If the second flexible circuit board FPC2 is disposed parallel to the top face of the first substrate SUB1 and connected to the top surface of the first substrate SUB1, which is adjacent to one side of the first substrate SUB1, an area required for the data driver DDR in a plan view of the display device DD may be undesirably large. In an embodiment, since the data driver DDR is connected to the second side surfaces SF2 of the first substrate SUB1, the area required for the data driver DDR may be minimized in the plan view of the display device DD.

Advantageously, the display device DD according to an embodiment may have a narrow bezel with minimized areas for accommodating the first and second gate drivers GDR1 and GDR2 and the data driver DDR.

FIGS. 11 to 16 are views for explaining a method for manufacturing the display device according to an embodiment.

FIGS. 11 to 16 may be related to side surfaces and cross-sections illustrated in FIGS. 5, 6, 8, and 9.

Figure 11:
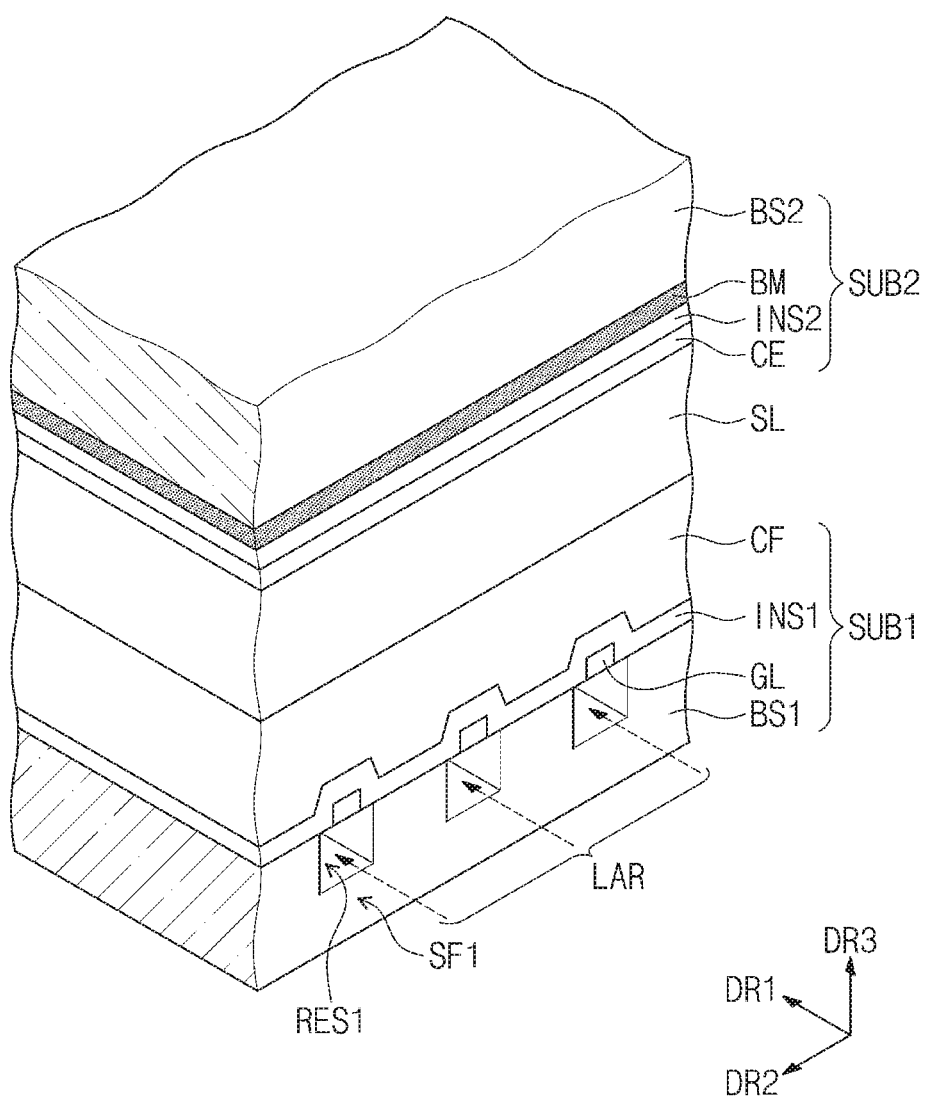
FIG. 11, FIG. 12, FIG. 13, FIG. 14, FIG. 15, and FIG. 16 are views illustrating structures formed in a method for manufacturing the display device according to an embodiment.
Figure 12:
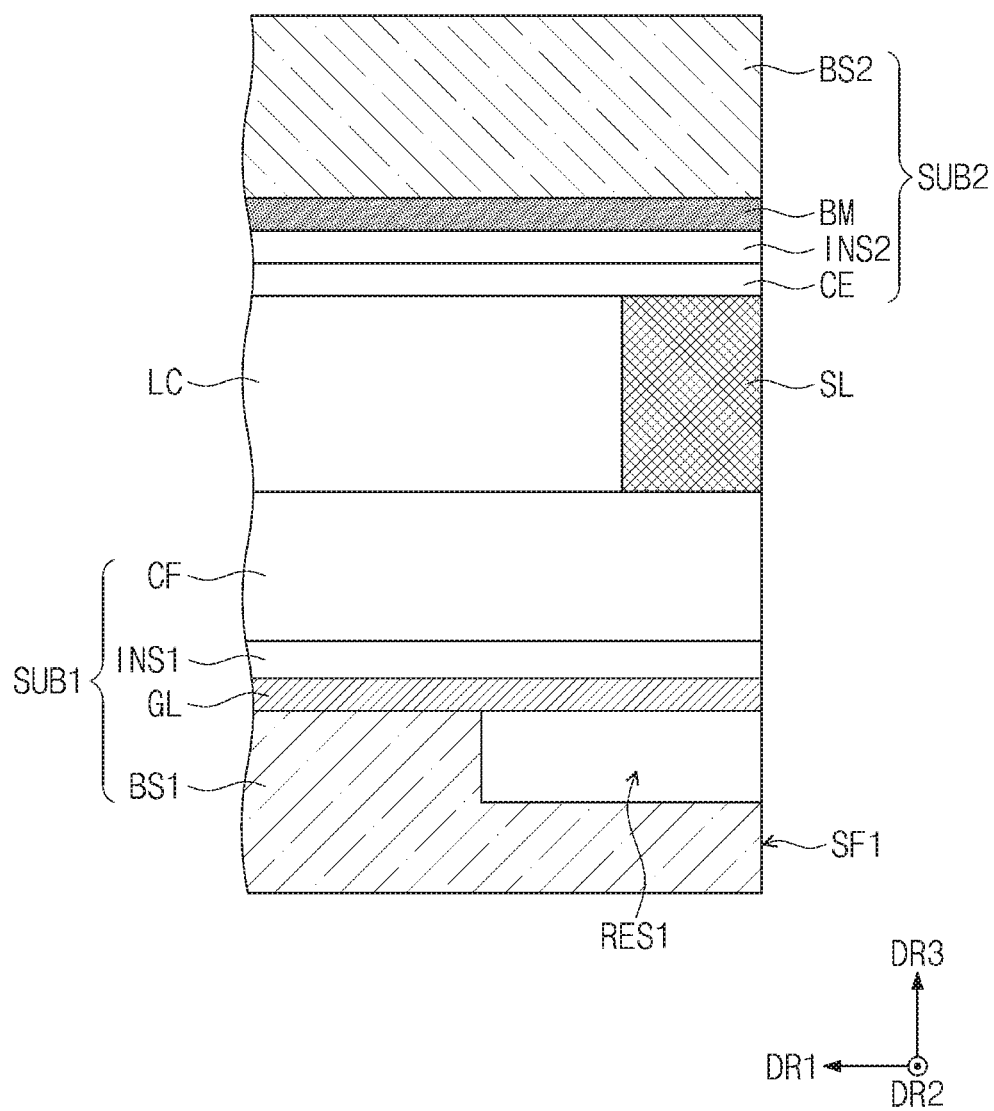

Referring to FIGS. 11 and 12, the first substrate SUB1 and the second substrate SUB2, which are bonded by the encapsulation layer SL, may be prepared. Recessed portions RES1 and RES2 may not have been formed in the first substrate SUB1.

A laser LAR may be irradiated toward the first side surface SF1. The laser LAR may be irradiated toward portions of the first side surface SF1 below the gate lines GL, respectively. The first recessed portions RES1 may be formed in the first side surface SF1 of the first base substrate BS1 by the laser LAR. Lower portions of the gate lines GL may be exposed by the first recessed portions RES1.

Figure 13:
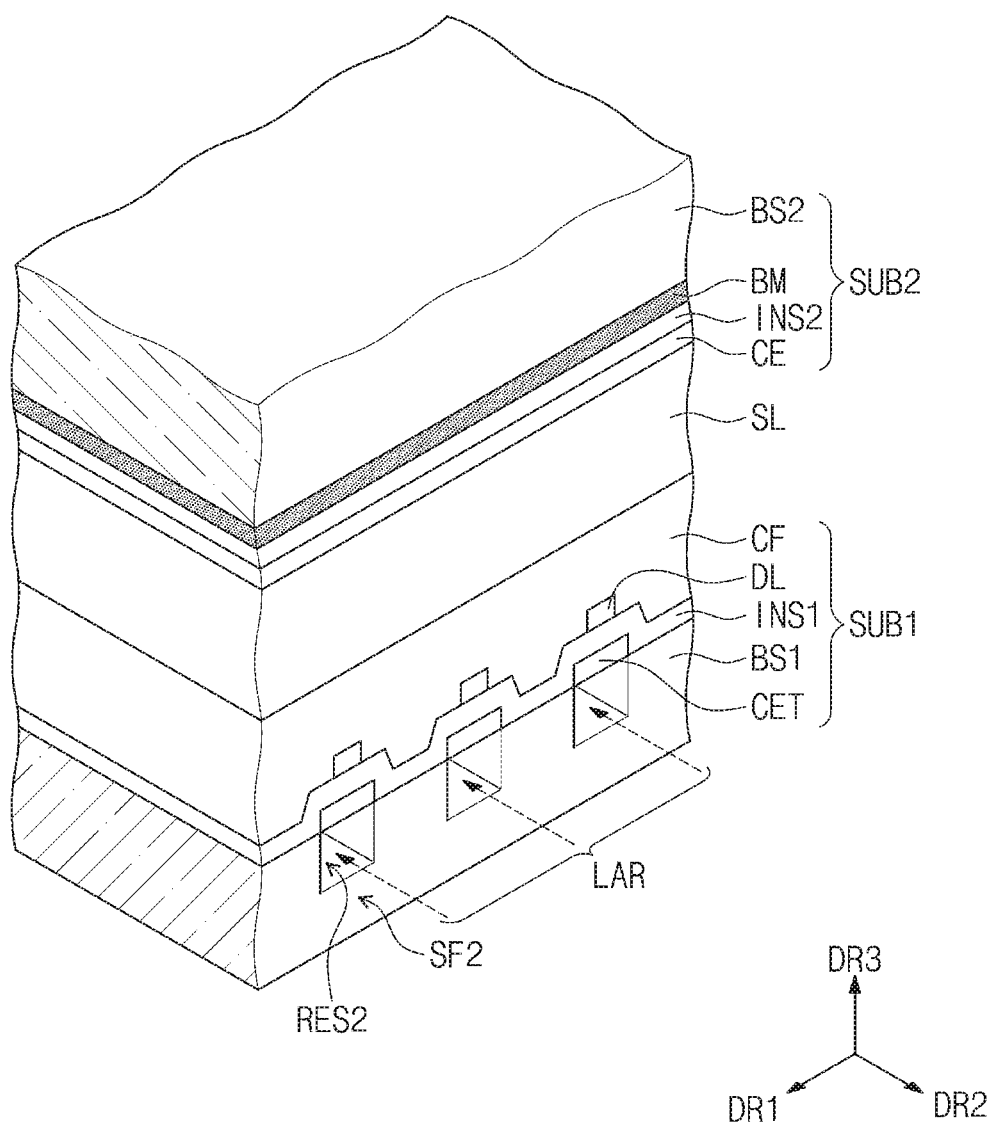
Figure 14:
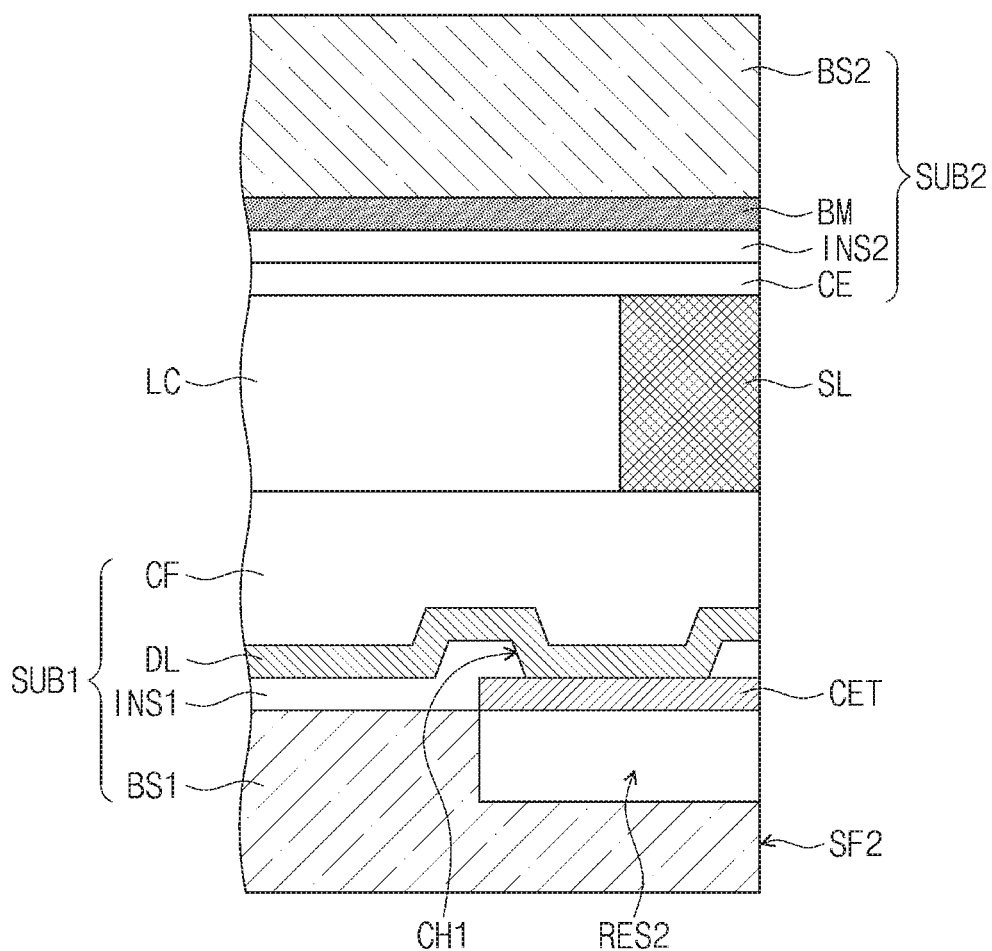

Referring to FIGS. 13 and 14, the laser LAR may be irradiated toward the second side surface SF2. The laser LAR may be irradiated toward portions of the second side surface SF2 below the connection electrodes CET, respectively. The second recessed portions RES2 may be formed in the second side surface SF2 of the first base substrate BS1 by the laser LAR. Lower portions of the connection electrodes CET may be exposed by the second recessed portions RES2.

Figure 15:
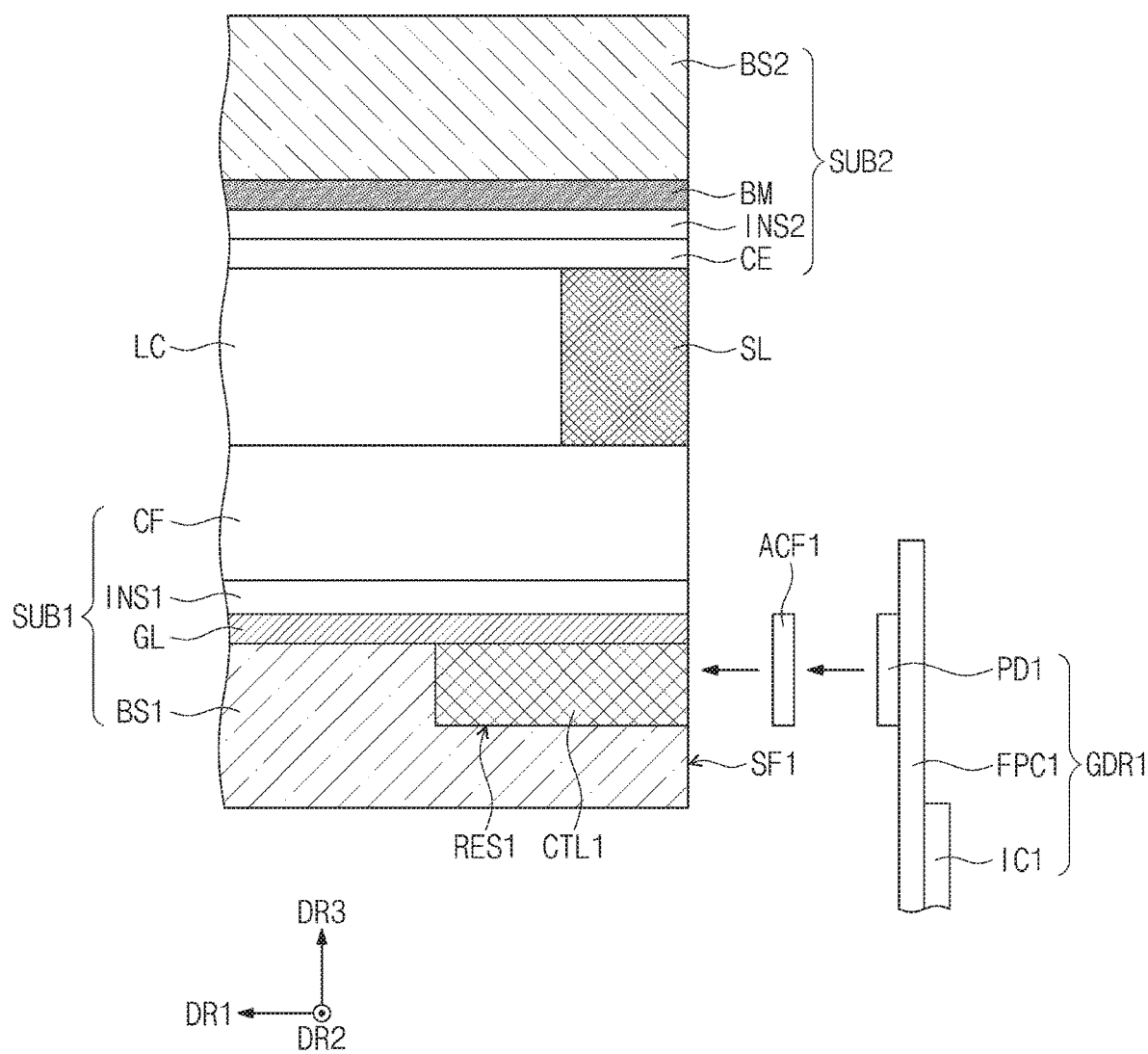
Figure 16:
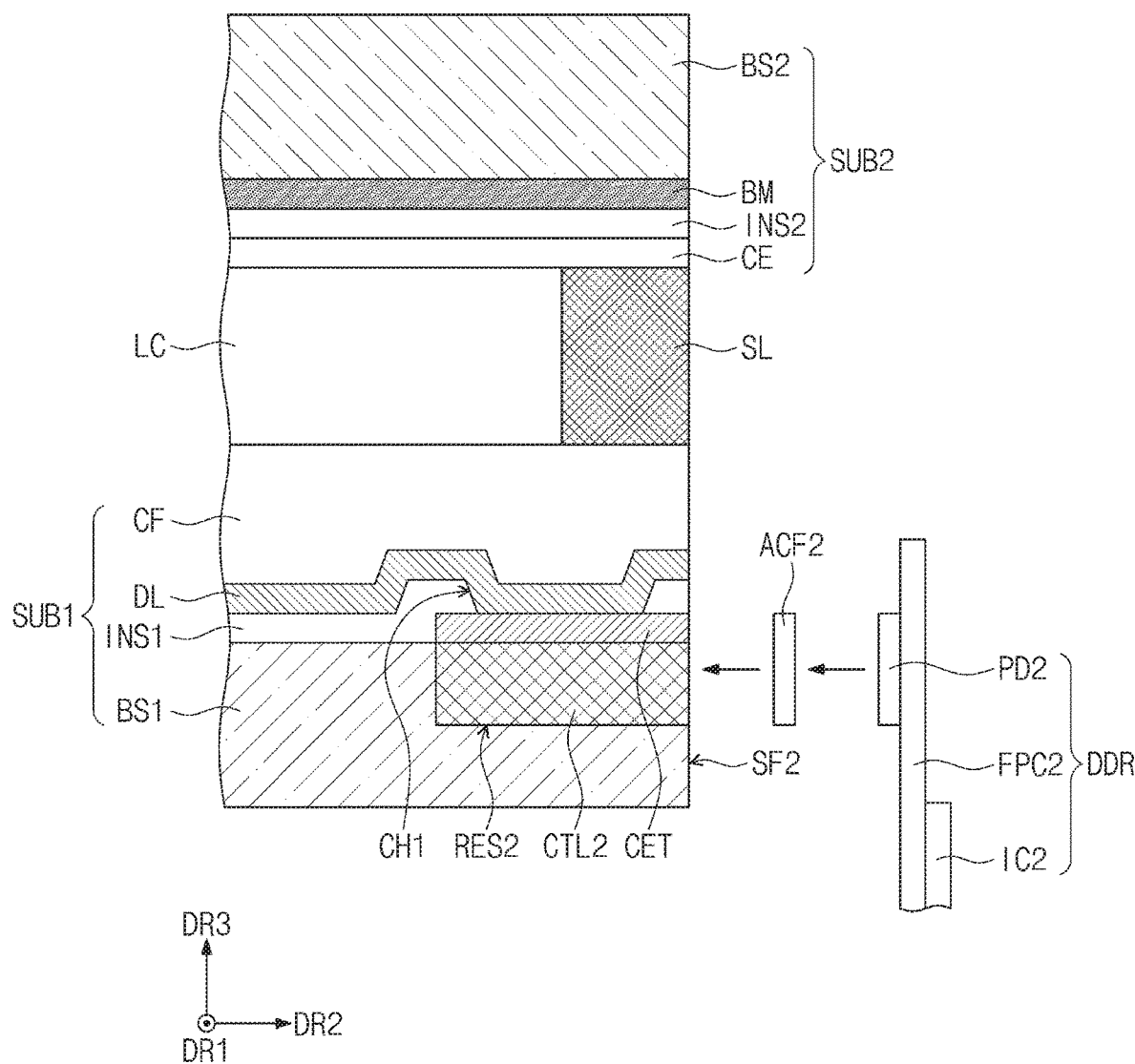

Referring to FIGS. 15 and 16, a first conductive layer CTL1 may be provided in each first recessed portion RES1, and a second conductive layer CTL2 may be provided in each second recessed portion RES2. The first conductive layer CTL1 may be connected to the corresponding gate line GL, and the second conductive layer CTL2 may be connected to the corresponding data line DL through the connection electrode CET.

Each of the conductive layers CTL1 and CTL2 may contain metal. For example, each of the conductive layers CTL1 and CTL2 may contain at least one of silver, gold, and titanium. The first conductive layer CTL1 and the second conductive layer CTL2 may be provided in the first recessed portion RES1 and the second recessed portion RES2, respectively, through an inkjet or spray method.

The first gate driver GDR1 may be connected to the first conductive layer CTL1 by the first anisotropic conductive film ACF1. For example, the first pads PD1 may be connected to the first conductive layer CTL1 by the first anisotropic conductive film ACF1. The method of connecting the first pads PD1 to the first conductive layer CTL1 by the first anisotropic conductive film ACF1 is described above. The second gate driver GDR2 may be connected to the first substrate SUB1 in an analogous manner.

The data driver DDR may be connected to the second conductive layer CTL2 by the second anisotropic conductive film ACF2. For example, the second pads PD2 may be connected to the second conductive layer CTL2 by the second anisotropic conductive film ACF2. The method of connecting the second pads PD2 to the second conductive layer CTL2 by the second anisotropic conductive film ACF2 is described above.

According to the above-described manufacturing process, the gate drivers GDR1 and GDR2 may be connected to the gate lines GL by the first conductive layers CTL1, and the data driver DDR may be connected to the data lines DL by the second conductive layers CTL2.

FIGS. 17 to 23 are views for explaining a method for manufacturing a display device according to an embodiment.

FIGS. 17 to 23 may be related to cross-sections illustrated in FIGS. 6 and 9. Differences from the manufacturing method described with references FIGS. 11 to 16 are described.

Figure 17:
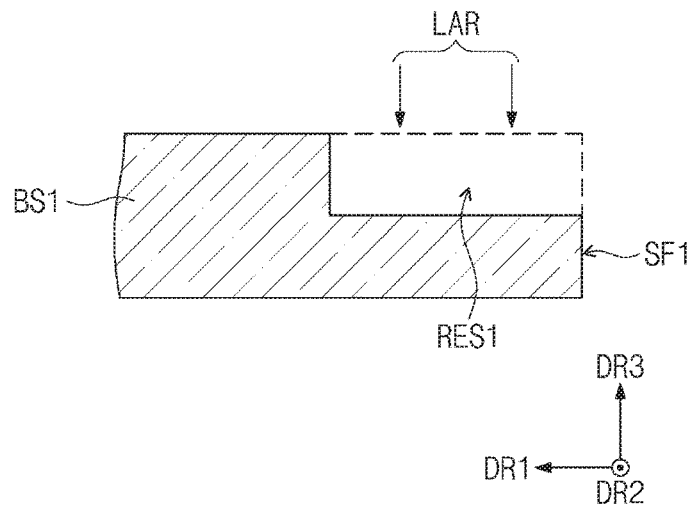
FIG. 17, FIG. 18, FIG. 19, FIG. 20, FIG. 21, FIG. 22, and FIG. 23 are views illustrating structures formed in a method for manufacturing a display device according to another embodiment.
Figure 18:
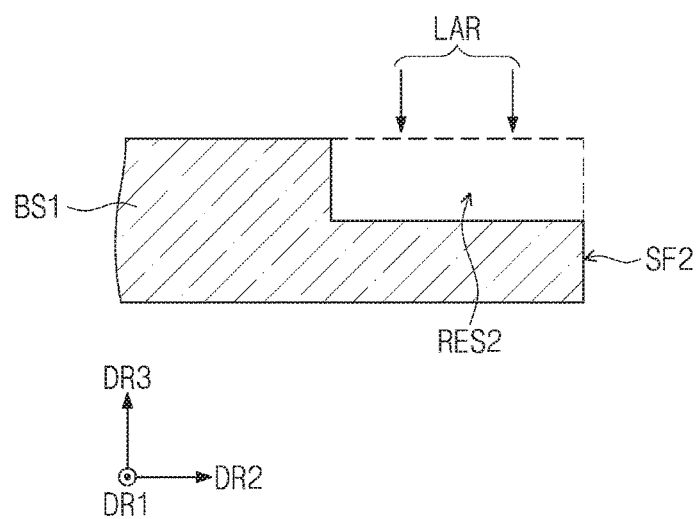

Referring to FIGS. 17 and 18, a laser LAR may be irradiated toward a first part of a top surface of a first base substrate BS1 that is adjacent to a first side surface SF1 of the first base substrate BS1. A first recessed portion RES1 may be formed by the laser LAR and may be recessed from (or recessed relative to) the first side surface SF1 of the first base substrate BS1.

The laser LAR may be irradiated toward a second part of the top surface of the first base substrate BS1 that is adjacent to a second side surface SF2 of the first base substrate BS1. A second recessed portion RES2 may be formed by the laser LAR and may be recessed from (or recessed relative to) the second side surface SF2 the first base substrate BS1.

Figure 19:
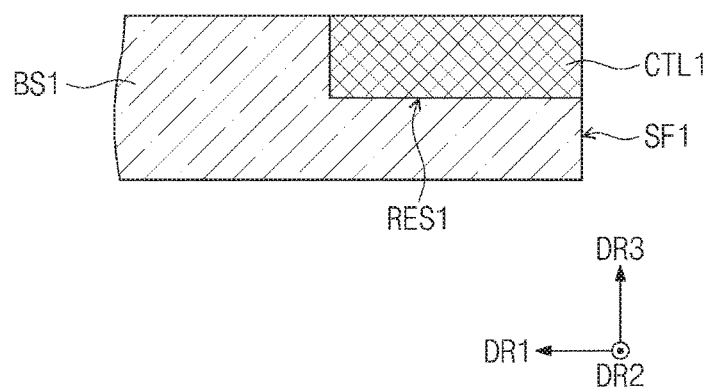
Figure 20:
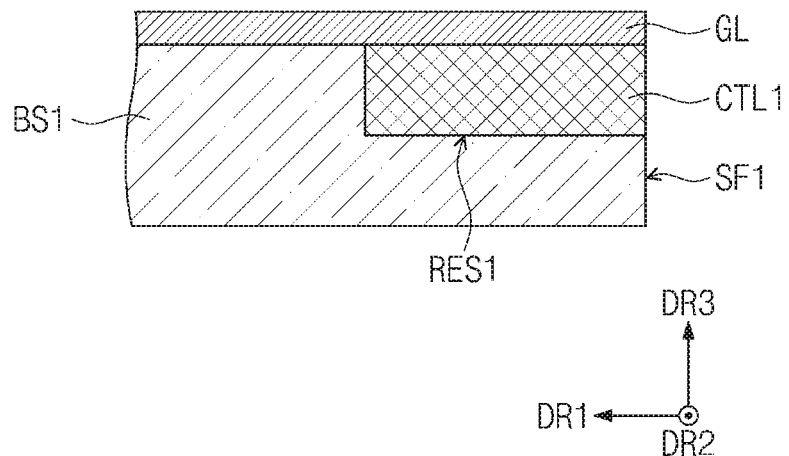

Referring to FIGS. 19 and 20, a first conductive layer CTL1 may be provided in the first recessed portion RES1. A gate line GL may be provided on the first conductive layer CTL1. The gate line GL may contact the first conductive layer CTL1 and may be electrically connected to the first conductive layer CTL1.

Figure 21:
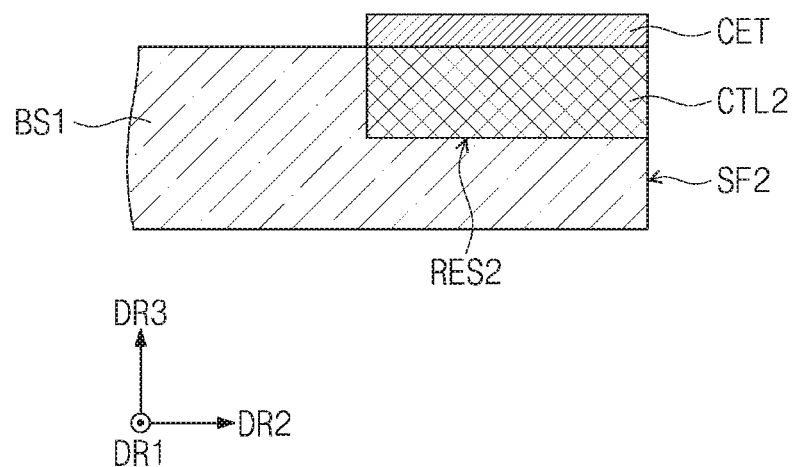

Referring to FIG. 21, a second conductive layer CTL2 may be provided in the second recessed portion RES2. A connection electrode CET may be provided on the second conductive layer CTL2. The connection electrode CET may contact the second conductive layer CTL2 and may be electrically connected to the second conductive layer CTL2.

Figure 22:
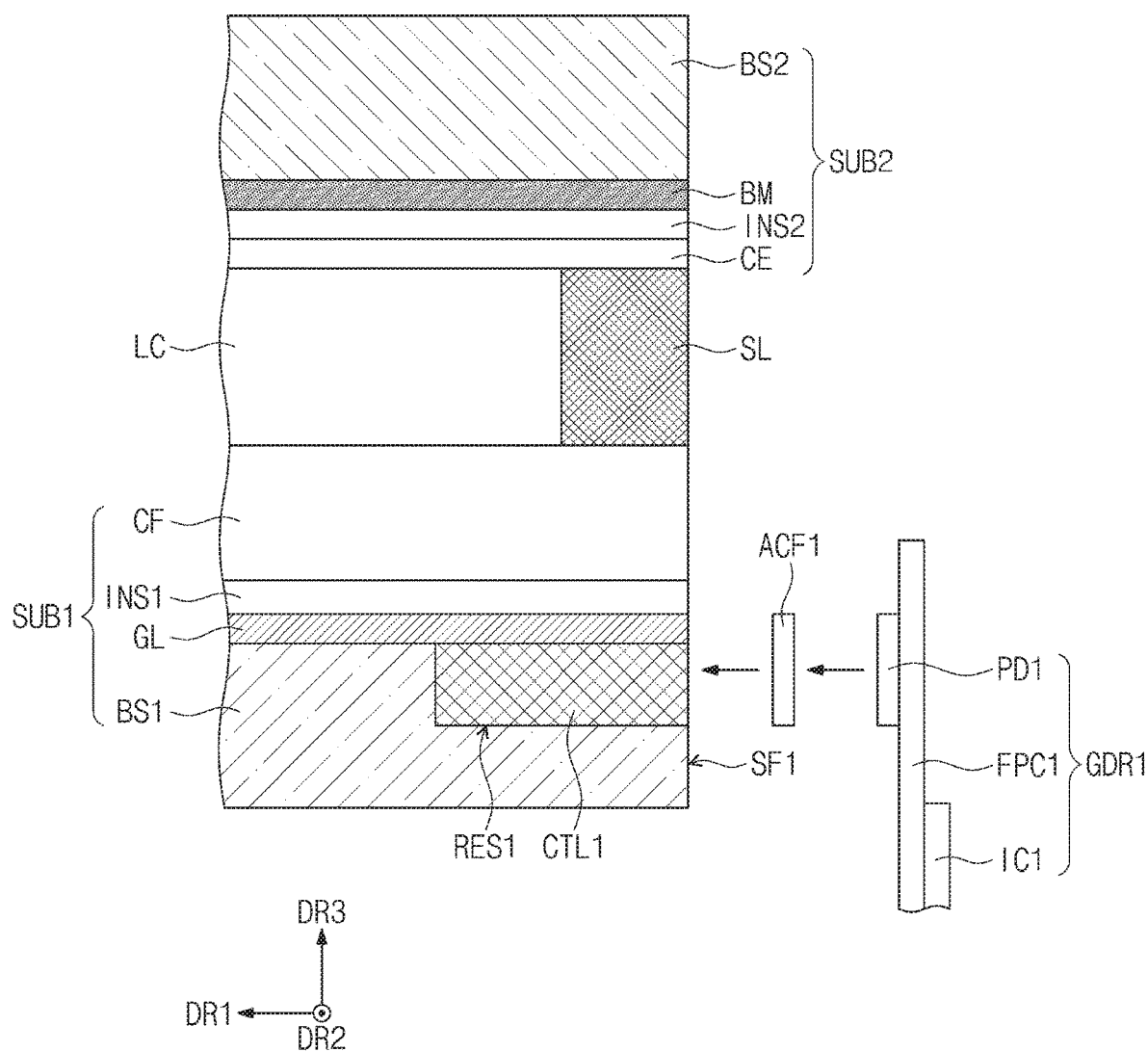
Figure 23:
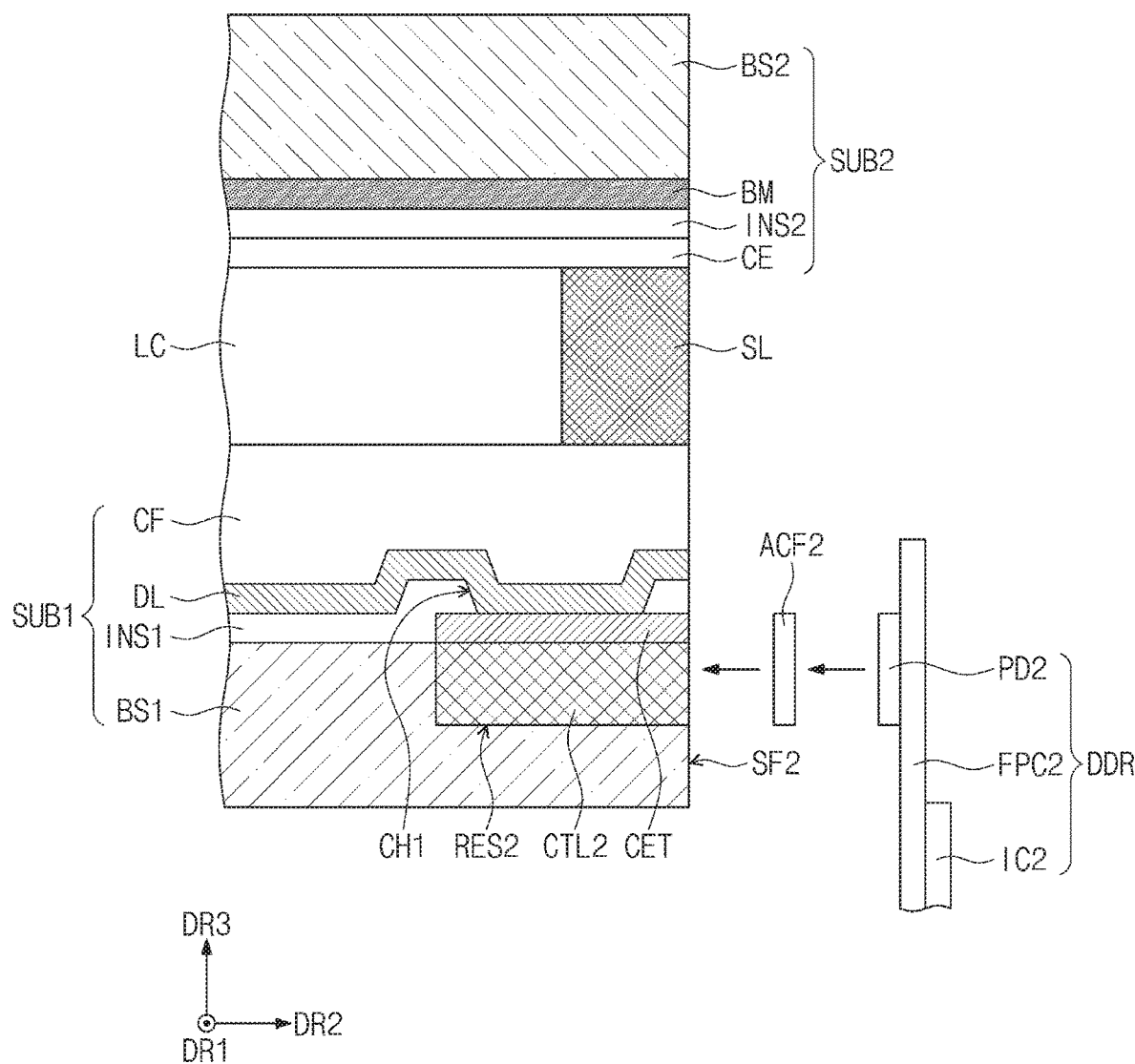

Referring to FIGS. 22 and 23, a first insulation layer INS1 may be disposed on the first base substrate BS1 to cover the gate line GL and the connection electrode CET. A data line DL and a color filter CF are disposed on the first insulation layer INS1 to form a first substrate SUB1. Although not shown, the first substrate SUB1 may include a transistor TR and a pixel electrode PE. The data line DL may be electrically connected to the connection electrode CET through a first contact hole CH1 positioned in the first insulation layer INS1.

A second substrate SUB2 may be disposed on the first substrate SUB1, and the substrates SUB1 and SUB2 may be bonded to each other by an encapsulation layer SL.

A first pad PD1 of a first gate driver GDR1 may be connected to the first conductive layer CTL1 by a first anisotropic conductive film ACF1. A second gate driver GDR2 may be also connected to the first substrate SUB1 in the same manner as the first gate driver GDR1. A second pad PD2 of a data driver DDR may be connected to the second conductive layer CTL2 by a second anisotropic conductive film ACF2.

Figure 24:
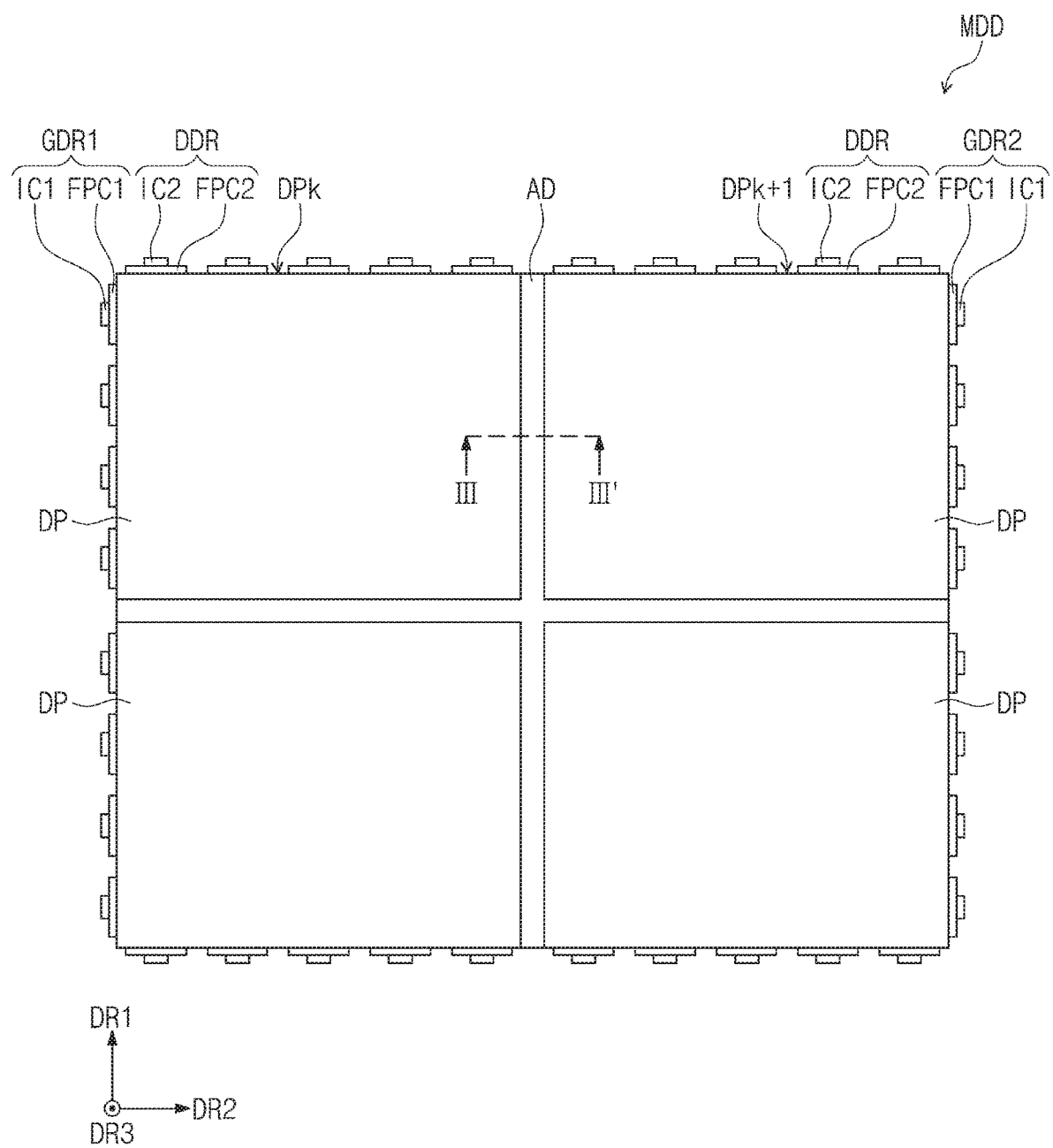
FIG. 24 is a view illustrating a multi-display device according to an embodiment.
Figure 25:
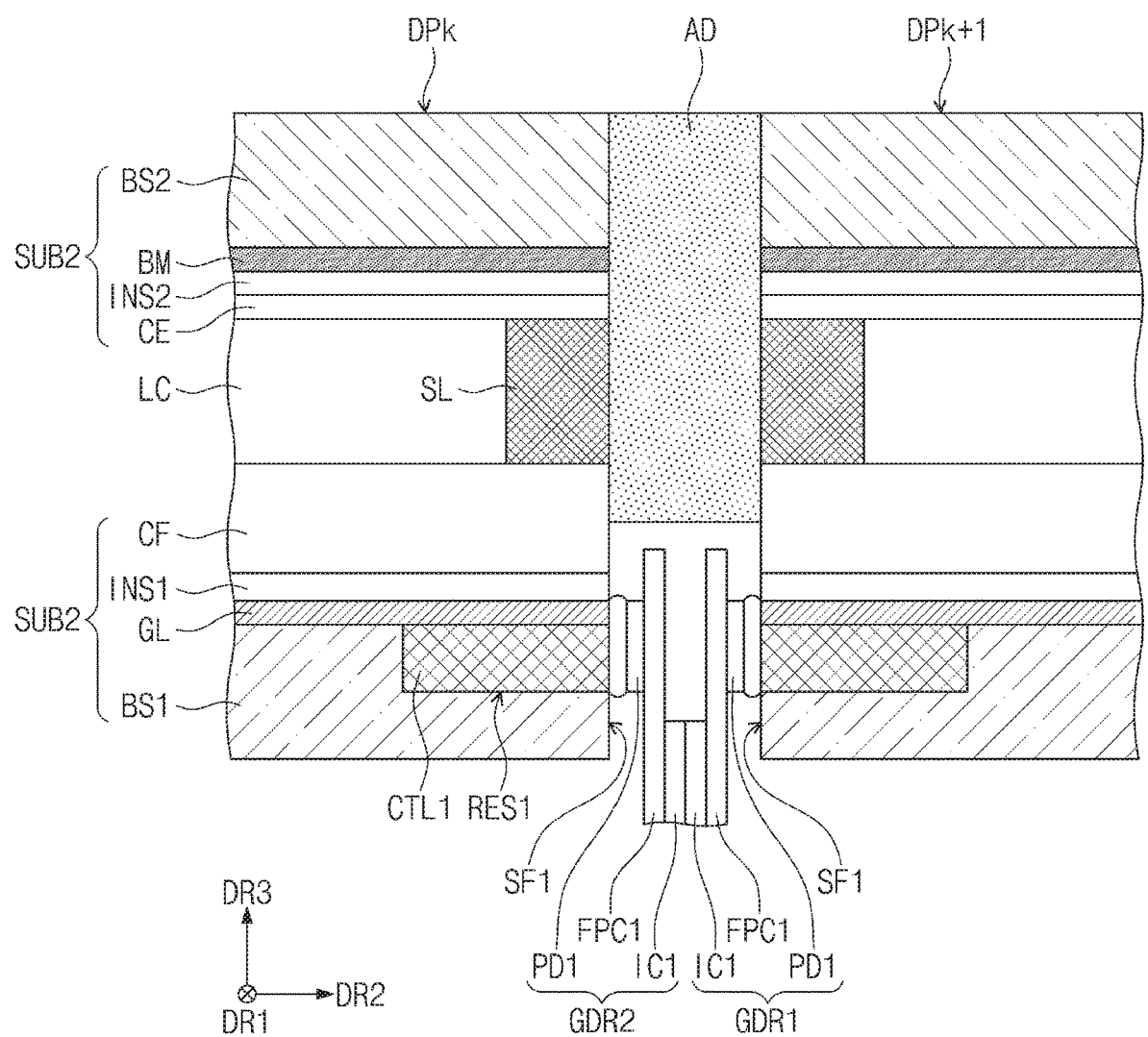
FIG. 25 is a cross-sectional view taken along line III-III' of FIG. 24 according to an embodiment.

FIG. 24 is a view illustrating a multi-display device according to an embodiment. FIG. 25 is a cross-sectional view taken along line III-III' of FIG. 24 according to an embodiment.

Referring to FIGS. 24 and 25, a multi-display device MDD may include a plurality of display panels DP. Although four display panels DP arranged in two rows and two columns are illustrated, the number and/or arrangement of the display panels DP may be configured according to embodiments. The display panels DP may include a k-th display panel DPk and a k+1-th display panel DPk+1 that immediately neighbor each other.

Gate drivers GDR1 and GDR2 and a data driver DDR may be connected to each of the display panels DP. A configuration of connecting the gate drivers GDR1 and GDR2 and the data driver DDR to the display panel DP is the same as that previously described in one or more of FIGS. 1 to 10.

As illustrated in FIG. 25, a first side surface SF1 of a k-th display panel DPk and a first side surface SF1 of an immediately neighboring k+1-th display panel DPk+1 may face each other. Thus, the second gate driver GDR2 connected to the k-th display panel DPk and the first gate driver GDR1 connected to the k+1-th display panel DPk+1 may be adjacent to each other, may face or contact each other, and may be positioned between the display panels DPk and DPk+1. Here, the reference symbol k is a natural number.

The second gate driver GDR2 connected to the k-th display panel DPk and the first gate driver GDR1 connected to the k+1-th display panel DPk+1 may be disposed opposite each other. The data drivers DDR connected to the display panels DP may be disposed toward the outside of the multi-display device MDD.

An adhesive agent AD may be disposed between the display panels DP. The adhesive agent AD may be spaced from each of the gate drivers GDR1 and GDR2 and may directly contact second base substrates BS2 and/or encapsulation layers SL. The display panels DP may be connected to each other by the adhesive agent AD. Since an area for accommodating the gate drivers GDR1 and GDR2 and the data drivers DDR may be minimized, a bezel area of the multi-display device MDD may be minimized.

According to embodiments, a gate driver and a data driver may be connected to conductive layers disposed in recessed portions positioned in a first substrate in order to be connected to side surfaces of a display panel. Since the gate driver and the data driver are connected to the side surfaces of the first substrate, in a plan view of the display device, the area required for accommodating the gate driver and the data driver may be minimized to realize a narrow bezel of the display device.

Although example embodiments have been described, various changes and modifications can be made by one ordinary skilled in the art within the scope of the following claims.

What is claimed is:

1. A display device comprising:
   a first base substrate;
   a second base substrate overlapping the first base substrate;
   an image display layer disposed between the first base substrate and the second base substrate;
   a gate driver disposed at a first side surface of the first base substrate;
   a data driver disposed at a second side surface of the first base substrate;
   first conductive layers respectively disposed in first recesses recessed from the first side surface of the first base substrate;
   gate lines extending lengthwise individually in the first direction, overlapping the first base substrate, separate from the first conductive layers, disposed on the first conductive layers, and respectively electrically connected to the first conductive layers;
   data lines extending lengthwise individually in the second direction, electrically insulated from the gate lines, and overlapping the first base substrate; and
   pixels electrically connected to the gate lines and the data lines,
   wherein a first recess among the first recesses comprises three flat faces formed of a same material,
   wherein a first conductive layer among the first conductive layers directly contacts each of the three flat faces and directly contacts a flat contact face of a gate line among the gate lines,
   wherein the gate driver comprises first pads and a first driving chip electrically connected through the first pads to the first conductive layers, and
   wherein a first pad among the first pads overlaps a flat contact face of the first conductive layer exposed through the first side surface of the first base substrate.

2. The display device of claim 1, wherein the second side surface of the first base substrate extends lengthwise in a first direction, wherein the first side surface of the first base substrate extends lengthwise in a second direction different from the first direction, and wherein the first recesses are arranged in the second direction and have respective depths in the first direction.

3. The display device of claim 2, further comprising:
   data lines extending lengthwise individually in the second direction, electrically insulated from the gate lines, and overlapping the first base substrate; and
   pixels electrically connected to the gate lines and the data lines.

4. The display device of claim 3, wherein each of the first conductive layers is wider than each of the gate lines in the second direction.

5. The display device of claim 3, wherein the gate driver further comprises:
   a first flexible circuit board,
   wherein the first driving chip is disposed directly on a first face of the first flexible circuit board, and
   wherein the first pads are disposed directly on a second face of the first flexible circuit board opposite the first face of the first flexible circuit board.

6. The display device of claim 5, wherein the first flexible circuit board overlaps the first side surface of the first base substrate.

7. The display device of claim 3, further comprising second conductive layers respectively disposed in second recesses recessed from the second side surface of the first base substrate,
wherein the second recesses are arranged in the first direction and have respective depths in the second direction, and wherein the data driver is electrically connected to the second conductive layers.

8. The display device of claim 7, wherein the data lines are respectively electrically connected to the second conductive layers.

9. The display device of claim 7, further comprising connection electrodes disposed between the second conductive layers and the data lines to electrically connect the data lines and the second conductive layers.

10. The display device of claim 9, wherein each of the second conductive layers and each of the connection electrodes is wider than each of the data lines in the first direction.

11. The display device of claim 9, wherein faces of the connection electrodes are coplanar with faces of the gate lines.

12. The display device of claim 7, wherein the data driver comprises:
a second flexible circuit board;
a second driving chip mounted to the second flexible circuit board; and
second pads disposed on the second flexible circuit board, electrically connected to the second driving chip, and respectively electrically connected to the second conductive layers.

13. The display device of claim 12, wherein the second flexible circuit board overlaps the second side surface of the first base substrate.

14. A method for manufacturing a display device, comprising:
preparing first recesses that are recessed from a first side surface of a first base substrate by at least irradiating a first laser toward the first side surface of the first base substrate in a first direction;
preparing second recesses that are recessed from a second side surface of the first base substrate;
providing first conductive layers in the first recesses, respectively;
providing second conductive layers in the second recesses, respectively;
providing gate lines disposed on the first base substrate, respectively electrically connected to the first conductive layers, and each extending lengthwise in the first direction
electrically connecting a gate driver to the first conductive layers; and
electrically connecting a data driver to the second conductive layers,
wherein a first recess among the first recesses comprises three flat faces formed of a same material, and wherein a first conductive layer among the first conductive layers directly contacts each of the three flat faces.

15. The method of claim 14, further comprising: providing data lines respectively electrically connected to the second conductive layers and each extending lengthwise in a second direction different from the first direction, and wherein the preparing of the second recesses comprises irradiating a second laser toward the second side surface of a first base substrate in the second direction.

16. The method of claim 14, further comprising:
providing an insulation layer on the first base substrate to cover the gate lines, wherein the data lines are provided on the insulation layer,
wherein the second side surface of the first base substrate extends lengthwise in the first direction, wherein the first side surface of the first base substrate extends lengthwise in the second direction, wherein the first recesses have respective depths in the first direction, and wherein the second recesses have respective depths in the second direction.

17. The method of claim 14, wherein the gate driver comprises:
a first flexible circuit board;
a first driving chip mounted to the first flexible circuit board; and
first pads disposed on the first flexible circuit board, electrically connected to the first driving chip, and respectively electrically connected to the first conductive layers, and
wherein the data driver comprises:
a second flexible circuit board;
a second driving chip mounted to the second flexible circuit board; and
second pads disposed the second flexible circuit board, electrically connected to the second driving chip, and respectively electrically connected to the second conductive layers.

18. The method of claim 14, wherein the preparing of the first recesses comprises irradiating a first laser toward a first portion of a face of the first base substrate, wherein the first portion of the face of the first base substrate is adjacent to the first side surface of the first base substrate, wherein the preparing of the second recesses comprises irradiating the first laser or a second laser toward a second portion of the face of the first base substrate, and wherein the second portion of the face of the first base substrate is adjacent to the second side surface of the first base substrate.

19. The method of claim 18, further comprising:
providing gate lines and connection electrodes on the first base substrate, wherein the gate lines are respectively electrically connected to the first conductive layers, and wherein the connection electrodes are respectively electrically connected to the second conductive layers;
providing an insulation layer on the first base substrate to cover the gate lines and the connection electrodes; and
providing data lines on the insulation layer, wherein the data lines are respectively electrically connected to the connection electrodes through first contact holes provided in the insulation layer.

20. A multi-display device comprising a plurality of display panels connected to each other,
wherein each of the display panels comprises:
a first base substrate;
a second substrate overlapping the first base substrate;
a gate line;
an image display layer disposed between the first base substrate and the second base substrate and overlapping the gate line;
a gate driver disposed at a first side surface of the first base substrate;
a data driver disposed at a second side surface of the first base substrate;

first conductive layers respectively disposed in first recesses recessed from the first side surface of the first base substrate; and second conductive layers respectively disposed in second recesses recessed from the second side surface of the first base substrate, wherein a first recess among the first recesses comprises three flat faces formed of a same material, wherein a first conductive layer among the first conductive layers directly contacts each of the three flat faces and directly contacts a flat contact face of the gate line, wherein the gate driver comprises first pads and a first driving chip electrically connected through the first pads to the first conductive layers, wherein a first pad among the first pads overlaps a flat contact face of the first conductive layer exposed through the first side surface of the first base substrate, wherein the gate line is separate from the first conductive layer and disposed on the first conductive layer, wherein the data driver is electrically connected to the second conductive layers, and wherein the first side surfaces of the first base substrates of two immediately neighboring ones of the display panels face each other.

* * * * *